(12) United States Patent
Murai et al.

(10) Patent No.: US 9,041,199 B2
(45) Date of Patent: May 26, 2015

(54) SEMICONDUCTOR DEVICE AND METHOD OF FABRICATING THE SAME

(75) Inventors: Makoto Murai, Oita (JP); Yoshimichi Harada, Kanagawa (JP)

(73) Assignee: Sony Corporation, Tokyo (JP)

( * ) Notice: Subject to any disclaimer, the term of this patent is extended or adjusted under 35 U.S.C. 154(b) by 308 days.

(21) Appl. No.: 12/650,654

(22) Filed: Dec. 31, 2009

(65) Prior Publication Data

US 2010/0176509 A1 Jul. 15, 2010

(30) Foreign Application Priority Data

Jan. 15, 2009 (JP) ................. 2009-006282

(51) Int. Cl.
*H01L 23/48* (2006.01)
*H01L 23/00* (2006.01)
(Continued)

(52) U.S. Cl.
CPC .............. *H01L 24/12* (2013.01); *H01L 21/563* (2013.01); *H01L 21/565* (2013.01); *H01L 23/3128* (2013.01); *H01L 23/49811* (2013.01); *H01L 23/49838* (2013.01); *H01L 24/16* (2013.01); *H01L 24/17* (2013.01); *H01L 24/28* (2013.01); *H01L 24/32* (2013.01); *H01L 24/81* (2013.01); *H01L 24/83* (2013.01); *H01L 25/03* (2013.01); *H01L 25/0657* (2013.01); *H01L 2224/1132* (2013.01); *H01L 2224/1134* (2013.01); *H01L 2224/1308* (2013.01); *H01L 2224/13082* (2013.01); *H01L 2224/13083* (2013.01); *H01L 2224/13111* (2013.01); *H01L 2224/13144* (2013.01); *H01L 2224/13147* (2013.01); *H01L 2224/13155* (2013.01); *H01L 2224/13166* (2013.01); *H01L 2224/16145* (2013.01); *H01L 2224/16225* (2013.01); *H01L 2224/27013* (2013.01); *H01L 2224/48091* (2013.01); *H01L 2224/48227* (2013.01); *H01L 2224/73203* (2013.01); *H01L 2224/81121* (2013.01); *H01L 2224/81193* (2013.01); *H01L 2224/81801* (2013.01); *H01L 2224/83051* (2013.01); *H01L 2224/83101* (2013.01); *H01L 2224/838* (2013.01); *H01L 2225/0651* (2013.01); *H01L 2225/06513* (2013.01); *H01L 2225/06582* (2013.01); *H01L 2924/01005* (2013.01);
(Continued)

(58) Field of Classification Search
CPC ........... H01L 2924/01078–2924/01079; H01L 2924/01029; H01L 2924/01013–2924/01014
USPC ............ 257/E23.01, 786, 787, 788, 789, 795, 257/77–784
See application file for complete search history.

(56) References Cited

U.S. PATENT DOCUMENTS

2003/0090006 A1* 5/2003 Farnworth .................... 257/787

FOREIGN PATENT DOCUMENTS

| JP | 2000-323624 | 11/2000 |
| JP | 2001-093937 | 4/2001 |

(Continued)

*Primary Examiner* — Hoa B Trinh
(74) *Attorney, Agent, or Firm* — Robert J. Depke; The Chicago Technology Law Group, LLC

(57) ABSTRACT

A semiconductor device includes: a mount body; a semiconductor chip mounted on the mount body via projecting connecting terminals; and a filling resin filled between the mount body and the semiconductor chip to seal the connecting terminals, the filling resin being retained inside the semiconductor chip in such a way as not to run out of at least one side portion in four side portions defining an outer peripheral portion of the semiconductor chip.

7 Claims, 16 Drawing Sheets

(51) Int. Cl.
*H01L 21/56* (2006.01)
*H01L 23/498* (2006.01)
*H01L 25/065* (2006.01)
*H01L 23/31* (2006.01)
*H01L 25/03* (2006.01)

(52) U.S. Cl.
CPC ........ *H01L2924/01013* (2013.01); *H01L 2924/01022* (2013.01); *H01L 2924/01029* (2013.01); *H01L 2924/01033* (2013.01); *H01L 2924/01047* (2013.01); *H01L 2924/0105* (2013.01); *H01L 2924/01078* (2013.01); *H01L 2924/01079* (2013.01); *H01L 2924/01082* (2013.01); *H01L 2924/0781* (2013.01); *H01L 2924/15311* (2013.01); *H01L 2924/19107* (2013.01); *H01L 2924/30105* (2013.01); *H01L 2224/0558* (2013.01); *H01L 24/48* (2013.01); *H01L 2224/05624* (2013.01); *H01L 2224/2919* (2013.01); *H01L 2924/00013* (2013.01); *H01L 2924/01006* (2013.01); *H01L 2924/01019* (2013.01); *H01L 2924/014* (2013.01); *H01L 2924/0665* (2013.01); *H01L 24/29* (2013.01); *H01L 2224/32225* (2013.01); *H01L 2224/73204* (2013.01); *H01L 2224/73265* (2013.01); *H01L 2924/0132* (2013.01); *H01L 2224/29111* (2013.01); *H01L 2224/83192* (2013.01); *H01L 2224/32145* (2013.01); *H01L 2224/92125* (2013.01); *H01L 2924/1579* (2013.01); *H01L 2224/26145* (2013.01); *H01L 2224/26175* (2013.01); *H01L 2224/73215* (2013.01); *H01L 2224/73253* (2013.01)

(56) References Cited

FOREIGN PATENT DOCUMENTS

| | | |
|---|---|---|
| JP | 2002-151833 | 5/2002 |
| JP | 2004-055848 | 2/2004 |
| JP | 2005-276879 | 10/2005 |
| JP | 2006-185989 | 7/2006 |
| JP | 2008-091529 | 4/2008 |
| JP | 2010-087239 | 4/2010 |

* cited by examiner

SEMICONDUCTOR DEVICE AND METHOD OF FABRICATING THE SAME

The present application contains subject matter related to that disclosed in Japanese Priority Patent Application JP 2009-006282 filed in the Japan Patent Office on Jan. 15, 2009, the entire contents of which is hereby incorporated by reference.

BACKGROUND OF THE INVENTION

1. Field of the Invention

The present invention relates to a semiconductor device and a method of fabricating the same. Particularly, the invention relates to a semiconductor device having a semiconductor chip mounted on a mount body, and a method of fabricating the same.

2. Description of the Related Art

One of semiconductor devices known has a semiconductor chip mounted on a circuit board in a flip chip form. In this type of semiconductor device, the circuit board and the semiconductor chip are connected together electrically and mechanical via connecting terminals called bumps. To protect the connecting terminals, a filling resin called "underfill material" is filled between (in a cavity between) the circuit board and the semiconductor chip.

The underfill material is filled between the circuit board and the semiconductor chip using the capillarity. At that time, a flared fillet is formed at the outer peripheral portion of the semiconductor chip by the underfill material running out thereof. A thermoset resin, such as epoxy resin, is used as the underfill material. After the underfill material is injected and filled, in a liquid state, between the circuit board and the semiconductor chip, therefore, it is hardened by a heat treatment. At this time, stress originated from the thermal contraction of the underfill material may warp the circuit board. In addition, when a reliability test, such as a heat cycle test, is executed, the circuit board may be warped due to a similar reason.

JP-A-2000-323624 (Patent Document 1) discloses an art of injecting an underfill material in such a way that the length of the fillet formed at one side end surface of the semiconductor chip becomes longer than the distance from the top side of the circuit board to the back side of the semiconductor chip.

SUMMARY OF THE INVENTION

However, if the fillet is formed long as described in Patent Document 1, the contact area between the circuit board and the underfill material becomes wider. This widens the range in the board surface of the circuit board where stress originated from the thermal contraction of the underfill material is applied. Therefore, this makes it easier to cause warping of the circuit board. To form the fillet long, it is necessary to secure a wide area around the semiconductor chip for forming the fillet. Therefore, in case where passive elements or the like are mounted on the same side of the circuit board as the semiconductor chip is mounted, for example, it is necessary to set a mount area for the passive elements or the like, avoiding the fillet-forming area. This inevitably increases the size of the circuit board.

Therefore, it is desirable to provide a semiconductor device which can reduce stress originated from the thermal contraction of a filling resin to be filled between a mount body and a semiconductor chip, and a method of fabricating the same.

A semiconductor device according to one embodiment of the invention includes a mount body, a semiconductor chip mounted on the mount body via projecting connecting terminals, and a filling resin filled between the mount body and the semiconductor chip to seal the connecting terminals, the filling resin being retained inside the semiconductor chip in such a way as not to run out of at least one side portion in four side portions defining an outer peripheral portion of the semiconductor chip.

The semiconductor device according to the embodiment of the invention has a narrower contact area between the mount body and the filling resin as compared with a case where a resin fillet is formed all around the outer peripheral portion of the semiconductor chip which is mounted on the mount body. This narrows the range in the chip mount surface of the mount body where stress originated from the thermal contraction of the filling resin is applied.

According to another embodiment of the invention, there is provided a method of fabricating a semiconductor device, including the steps of fabricating a semiconductor chip having projecting connecting terminals, fabricating a mount body having a resin stop portion provided inside a chip mount area where the semiconductor chip is to be mounted, and mounting the semiconductor chip on the mount body via the connecting terminals, and filling a filling resin between the mount body and the semiconductor chip.

In the method of fabricating a semiconductor device according to this embodiment of the invention, when the filling resin is filled between the mount body and the semiconductor chip, the area which becomes wetted by the filling resin is restricted by the resin stop portion. Accordingly, the filling resin is stopped by the resin stop portion to stay inside the chip mount area. Therefore, the contact area between the mount body and the filling resin becomes narrower as compared with a case where a resin fillet is formed all around the outer peripheral portion of the semiconductor chip which is mounted on the mount body. This narrows the range in the mount surface of the mount body where stress originated from the thermal contraction of the filling resin is applied.

According to the embodiments of the invention, stress originated from the thermal contraction of the filling resin can be made lower as compared with a case where a resin fillet is formed all around the outer peripheral portion of the semiconductor chip which is mounted on the mount body.

DETAILED DESCRIPTION OF THE PREFERRED EMBODIMENTS

Specific embodiments of the present invention will be described in detail below with reference to the accompanying drawings. It is to be noted that the technical scope of the invention is not limited to embodiments to be described below, and includes modes in which various modifications and combinations thereof are made within the range that derives a particular effect obtained by the configuration of the present invention or a combination thereof.

The embodiments of the invention will be described in the following order.

1. First Embodiment
2. Second Embodiment
3. Third Embodiment
4. Fourth Embodiment
5. Fifth Embodiment
6. Sixth Embodiment

1. First Embodiment

Fabrication Method for Semiconductor Device

A fabrication method for a semiconductor device according to the first embodiment of the invention will be described.

The fabrication method for a semiconductor device mainly includes a chip fabrication step, a board fabrication step, a chip mounting step, and a sealing step. Either one of the chip fabrication step and the board fabrication step may be executed earlier, or both steps may be executed in parallel.

(Chip Fabrication Step)

Figure 1:
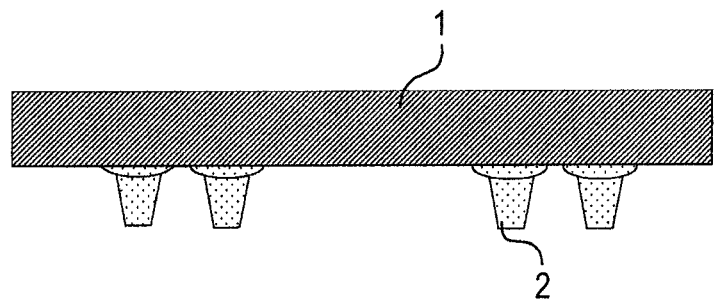
FIG. 1 is a diagram illustrating a fabrication method for a semiconductor device according to a first embodiment of the invention (part 1)

In the chip fabrication step, as shown in FIG. 1, a semiconductor chip 1 having projecting (convex) connecting terminals 2 is fabricated. The semiconductor chip 1 is formed of, for example, silicon as a main material, and each chip is diced from a semiconductor wafer whose back side is polished to have a predetermined thickness. The semiconductor chip 1 is formed into a quadrangle (square or rectangle) as viewed planarly. Unillustrated devices, wirings, etc. are formed in the major surface of the semiconductor chip 1. An unillustrated electrode pad (e.g., aluminum pad) is formed at the major surface (device forming surface) of the semiconductor chip 1, and the connecting terminals 2 of, for example, gold stud bumps are formed on the electrode pad. A plurality of connecting terminals 2 are formed in the major surface of the semiconductor chip 1. It is desirable that the heights of the individual connecting terminals 2 should be set to nearly the same heights by leveling.

(Board Fabrication Step)

Figure 2A:
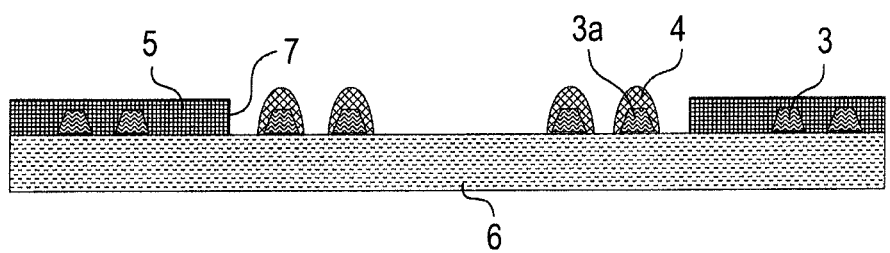
FIGS. 2A and 2B are diagrams illustrating the fabrication method for a semiconductor device according to the first embodiment of the invention (part 2)
Figure 2B:
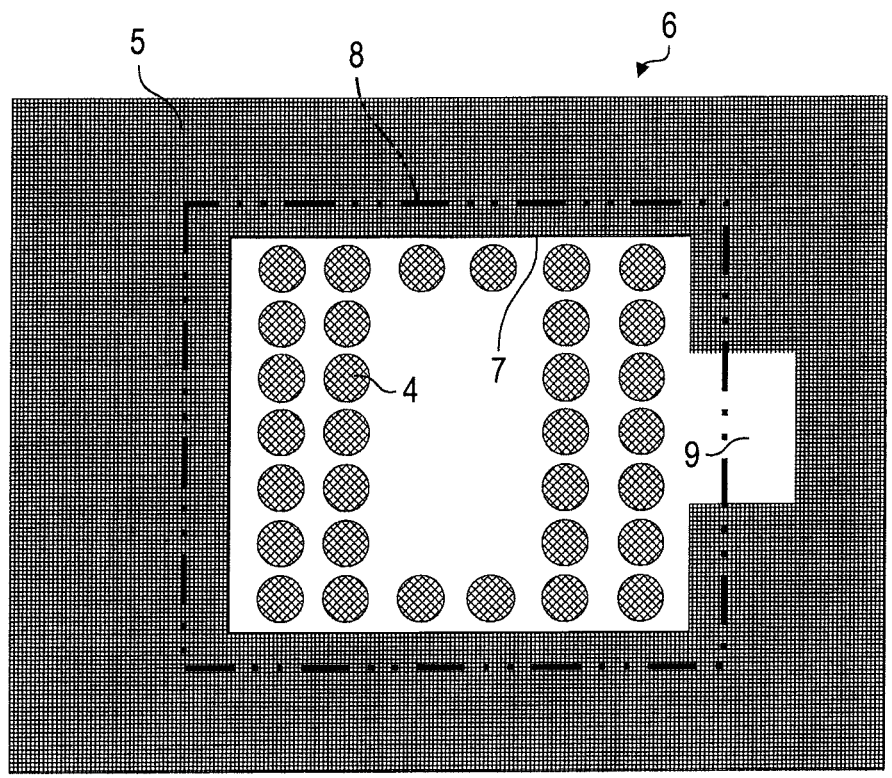

In the board fabrication step, a circuit board 6 having a wiring layer 3, a solder layer 4 and a protection layer 5 is fabricated as shown in a cross-sectional view in FIG. 2A and a plan view in FIG. 2B. The circuit board 6 contains an organic material, such as glass epoxy, as a main material. The circuit board 6, which serves as an interposer for chip mounting, is equivalent to a mount body. The wiring layer 3 is formed on the major surface (top surface in the diagrams) of the circuit board 6 using a conductive material. Parts 3a of the wiring layer 3 are covered with the solder layer 4. The solder layer 4 is precoated on the parts 3a of the wiring layer 3 by, for example, printing or the like. It is desirable that the precoat of the solder layer 4 should be applied with a uniform thickness to prevent short-circuiting between the connecting terminals and a connection failure thereof. For example, the thickness of the solder layer 4 is approximately 10 μm. The parts 3a of the wiring layer 3 are to be connected to the connecting terminals 2 of the semiconductor chip 1. Hereinafter, each part 3a of the wiring layer 3 will be referred to as "connecting target portion 3a". The connecting target portions 3a are provided in 1:1 association with the plurality of connecting terminals 2.

The protection layer 5 is formed using an insulating solder resist. The protection layer 5 is formed to protect the wiring layer 3 and prevent moisture absorption. The protection layer 5 is formed to cover the wiring layer 3 excluding the connecting target portions 3a. The protection layer 5 is formed by, for example, applying a solder resist on the entire major surface of the circuit board 6 by screen printing or the like, and then patterning the solder resist with exposure and development. The protection layer 5 has a quadrangle (square, rectangle or the like) as viewed planarly formed open so as to expose the connecting target portions 3a of the wiring layer 3, and the edge portion of the opening serves as a resin stop portion 7.

The resin stop portion 7 is provided with a step equivalent to the thickness of the protection layer 5. Given that the thickness of the protection layer 5 is 15 μm, the step of the resin stop portion 7 has approximately the same dimension as the thickness. The resin stop portion 7 is formed in an annular shape to surround the area of the wiring layer 3 where the connecting target portions 3a are arranged. A chip mount area 8 where the semiconductor chip 1 is to be mounted is set in the major surface of the circuit board 6. The chip mount area 8 is defined into a quadrangular shape as viewed planarly to match with the outer shape of the semiconductor chip 1. The resin stop portion 7 is formed inside the chip mount area 8 in a quadrangular shape as viewed planarly. Further, a resin injection portion 9 is provided in the major surface of the circuit board 6. The resin injection portion 9 is formed outside the chip mount area 8. The resin injection portion 9 is formed in such a way as to communicate with (connect to) the resin stop portion 7 by patterning the protection layer 5.

Though not illustrated, a metal wiring layer on which solder balls to be external connecting terminals is formed on the back side (side opposite to the major surface) of the circuit board 6. This metal wiring layer is exposed through the solder resist forming the protection layer, and is electrically connected to the wiring layer on the major surface (semiconductor chip mount surface) of the circuit board 6 via a through hole or the like.

(Chip Mounting Step)

Figure 3A:
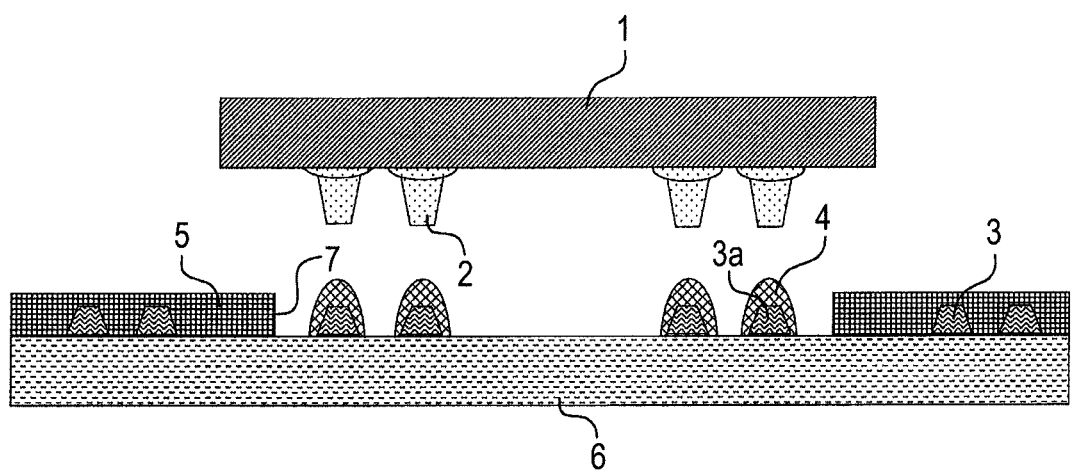
FIGS. 3A and 3B are diagrams illustrating the fabrication method for a semiconductor device according to the first embodiment of the invention (part 3)
Figure 3B:
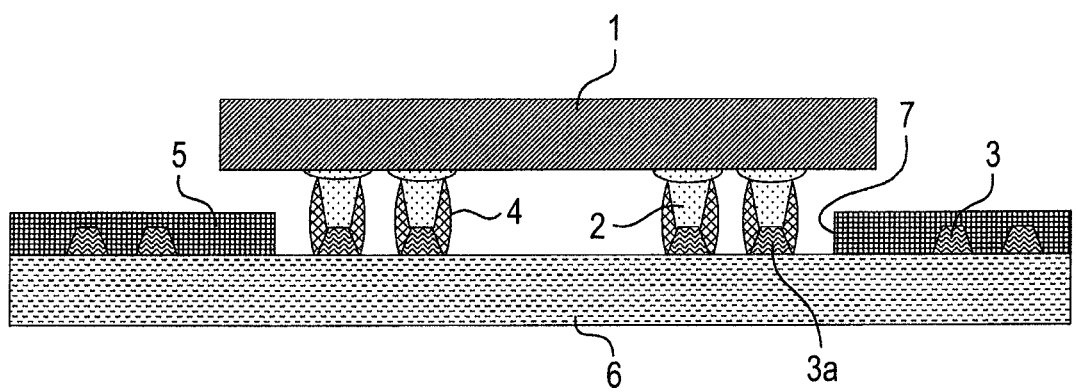

In the chip mounting step, with the major surface of the semiconductor chip 1 facing the major surface of the circuit board 6 as shown in FIG. 3A, the semiconductor chip 1 is mounted on the circuit board 6 via the connecting terminals 2 as shown in FIG. 3B. At this time, the semiconductor chip 1 and the circuit board 6 are connected together by a local reflow process. In the local reflow process, first, the chip's back side where the connecting terminals 2 of the semiconductor chip 1 are not formed is adsorbed by an unillustrated ceramic tool. Next, an alignment mark formed on the major surface of the semiconductor chip 1 adsorbed by the ceramic tool, and an alignment mark formed on the major surface of the circuit board 6 are recognized by respective cameras, and alignment is performed through image processing. Thereafter, with the connecting terminals 2 of the semiconductor chip 1 being made in contact with the solder layer 4 covering the connecting target portions 3a of the circuit board 6, heat is applied to the solder layer 4. The heating is carried out for a time needed for the solder material forming the solder layer 4 to substantially wet the connecting terminals 2. The ceramic tool is moved up or down to adjust the size of the clearance between the semiconductor chip 1 and the circuit board 6, so that excess stress is not applied to the connecting terminals 2.

Figure 4A:
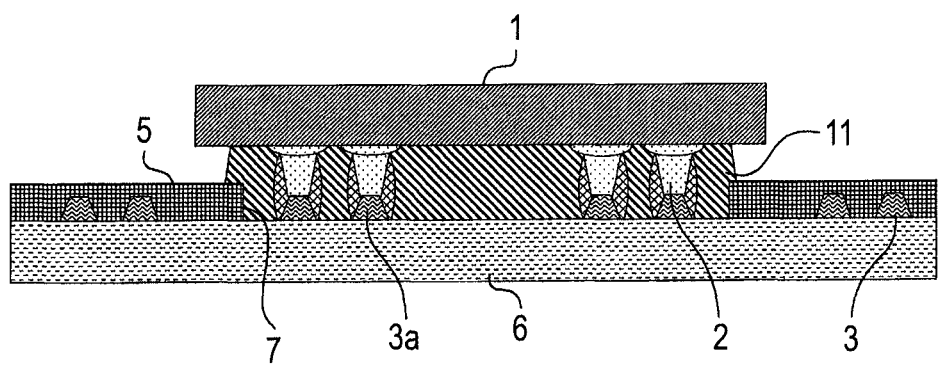
FIGS. 4A and 4B are diagrams illustrating the fabrication method for a semiconductor device according to the first embodiment of the invention (part 4)
Figure 4B:
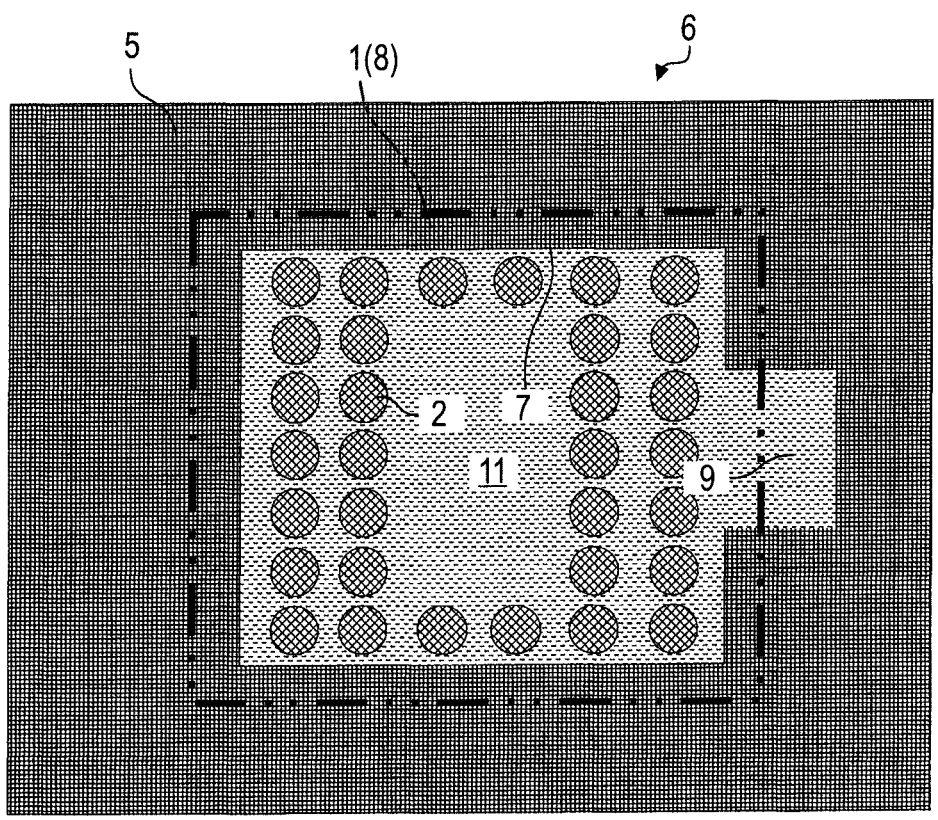

In the chip mounting step, as shown in FIGS. 4A and 4B, a filling resin 11 to be an underfill material is filled between (in the cavity between) the circuit board 6 and the semiconductor chip 1. The filling resin 11 is formed of an epoxy resin having a micro filer (diameter of 1 μm or less) mixed therein. At the time the filling resin 11 is filled, a liquid resin is dropped into the resin injection portion 9 from the needle of a micro syringe. The liquid resin dropped down to the resin injection portion 9 from the needle is permeated into the cavity portion between the semiconductor chip 1 and the circuit board 6 by the capillarity. At this time, the flow of the resin permeated on the major surface side of the semiconductor chip 1 by the capillarity is stopped by the resin stop portion 7. Accordingly, the area which is wetted by the resin is restricted by the resin stop portion 7. Therefore, the resin does not run out around the semiconductor chip 1, excluding the portion where the resin injection portion 9 is provided. As a result, the filling resin 11 is retained inside the semiconductor chip 1, excluding one side portion where the resin injection portion 9 is provided in the four side portions defining the outer peripheral portion of the semiconductor chip 1. In this state, the filling resin 11 is hardened in a heat treatment. It is to be noted that while a fillet is formed around the semiconductor chip 1 only at the portion of the resin injection portion 9, it is possible not to form a fillet at all by optimizing the supply amount of the resin.

(Sealing Step)

Figure 5:
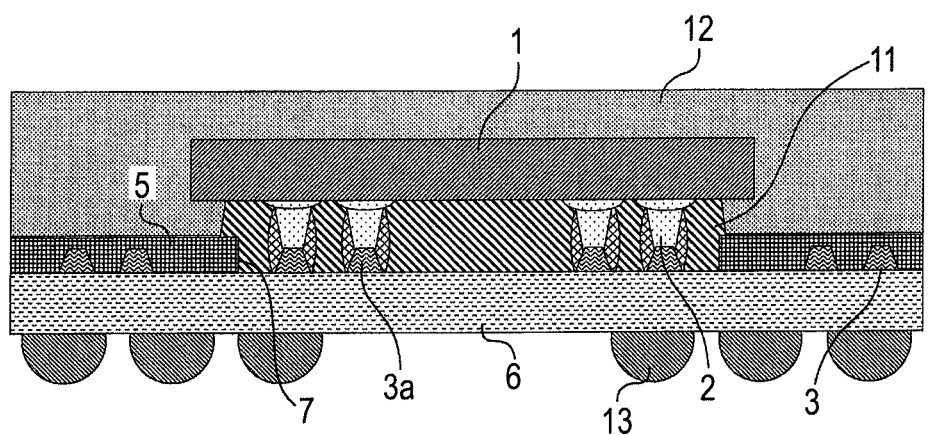
FIG. 5 is a diagram illustrating the fabrication method for a semiconductor device according to the first embodiment of the invention (part 5)

In the sealing step, as shown in FIG. 5, the semiconductor chip 1 is sealed with the sealing resin 12. A plurality of external connecting terminals 13 are formed on the surface of the circuit board 6 opposite to the major surface thereof. The external connecting terminals 13 are formed using solder balls, for example. The sealing resin 12, like the filling resin 11 used as an underfill material, is formed of a filler containing silica as a main component, and epoxy resin. Because the sealing resin 12, unlike the filling resin 11, need not be filled using the capillarity, the blending amount of the filler can be increased to set the thermal expansion coefficient closer to the material (silicon) of the semiconductor chip 1. Accordingly, the thermal expansion coefficient of the sealing resin 12 is closer to (preferably equal to) that of the chip material (silicon in this embodiment) of the semiconductor chip 1 than that of the filling resin 11. The thermal expansion coefficients of the materials for the individual parts will be exemplified. The thermal expansion coefficient of the semiconductor chip 1 is 2.6 (ppm/k), and the thermal expansion coefficient of the filling resin 11 to be an underfill material is 44 (ppm/k). The thermal expansion coefficient of the sealing resin 12 to be a mold material is 2.6 (ppm/k), the same as that of the semiconductor chip 1, and the thermal expansion coefficient of the circuit board 6 is 40 (ppm/k). The sealing resin 12 is molded to cover the entire semiconductor chip 1, including the portion in the semiconductor chip 1 which is not covered with the filling resin 11. The sealing resin 12 can surely be filled in the cavity in the semiconductor chip 1 by carrying out resin sealing with a method which achieves a high filling state, such as vacuum molding.

(Configuration of Semiconductor Device)

The semiconductor device provided by the foregoing fabrication method has the following configuration. The semiconductor chip 1 is mounted on the circuit board 6 via the projecting connecting terminals 2. The filling resin 11 is filled between the circuit board 6 and the semiconductor chip 1 to seal the plurality of connecting terminals 2. The resin stop portion 7 is formed in an annular shape inside the chip mount area 8 on the circuit board 6 in such a way as to surround the layout area of the connecting terminals 2, and retains the filling resin 11. Accordingly, the filling resin 11 is retained inside the semiconductor chip 1 in such a way as not to run out of three side portions in the four side portions defining the outer peripheral portion of the semiconductor chip 1, excluding one side portion where the resin injection portion 9 is provided.

According to the first embodiment of the invention, the contact area between the circuit board 6 and the filling resin 11 becomes narrower as compared with the case where a fillet is formed all around the outer peripheral portion of the semiconductor chip 1. This narrows the range in the board surface of the circuit board 6 where stress originated from the thermal contraction of the filling resin 11 is applied. It is therefore possible to relatively reduce the stress originated from the thermal contraction of the filling resin 11. As a result, warping of the circuit board 6 can be reduced, thus improving the reliability of connection with the semiconductor chip 1. In addition, the amount of the filling resin 11 supplied to a single semiconductor chip 1 becomes smaller. This leads to reduction in material cost and shorter process time, thus reducing the manufacturing cost. Furthermore, it is not necessary to secure the area for forming a fillet around the semiconductor chip 1. This can make the size of the circuit board 6 smaller.

The first embodiment of the invention employs the configuration such that the entire semiconductor chip 1 is sealed with the sealing resin 12, including the portion in the semiconductor chip 1 which is not covered with the filling resin 11. Accordingly, stress originated from the thermal contraction of the filling resin 11 and the semiconductor chip 1 can be reduced at the chip end of the major surface of the semiconductor chip 1. It is therefore possible to suppress the separation of the interlayer film on the major surface side of the semiconductor chip 1, thus improving the reliability over a long period of time.

The foregoing description of the first embodiment has discussed flip chip connection made by gold stud bumps and solder precoating by way of example, which is not restrictive. For example, another scheme, such as C4 (controlled collapsible chip connector) connection, may be used as well.

2. Second Embodiment

Fabrication Method for Semiconductor Device

A fabrication method for a semiconductor device according to the second embodiment of the invention will be described. The fabrication method for a semiconductor device mainly includes a chip fabrication step, a board fabrication step, a chip mounting step, and a sealing step. Either one of the chip fabrication step and the board fabrication step may be executed earlier, or both steps may be executed in parallel. The second embodiment of the invention will be described with same reference numerals given to those portions which are the same as the corresponding portions of the first embodiment.

(Chip Fabrication Step)

Figure 6:
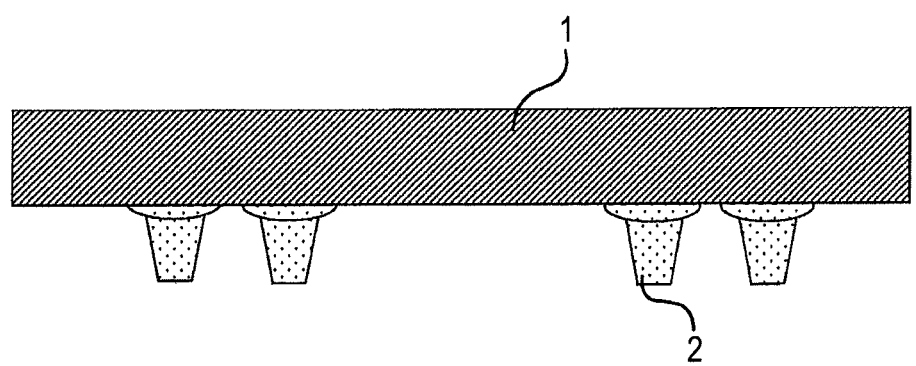
FIG. 6 is a diagram illustrating a fabrication method for a semiconductor device according to a second embodiment of the invention (part 1)

In the chip fabrication step, as shown in FIG. 6, a semiconductor chip 1 having projecting (convex) connecting terminals 2 is fabricated. The semiconductor chip 1 is formed of, for example, silicon as a main material, and each chip is diced from a semiconductor wafer whose back side is polished to have a predetermined thickness. The semiconductor chip 1 is formed into a quadrangle (square or rectangle) as viewed planarly. Unillustrated devices, wirings, etc. are formed in the major surface of the semiconductor chip 1. An unillustrated electrode pad (e.g., aluminum pad) is formed at the major surface (device forming surface) of the semiconductor chip 1, and the connecting terminals 2 are formed on the electrode pad via a barrier film for preventing mutual diffusion. For example, titanium is a possible composition of the barrier film. The connecting terminals 2 are post-like projecting electrodes formed of, for example, gold or copper, and desirably have the surfaces smoothed.

(Board Fabrication Step)

Figure 7A:
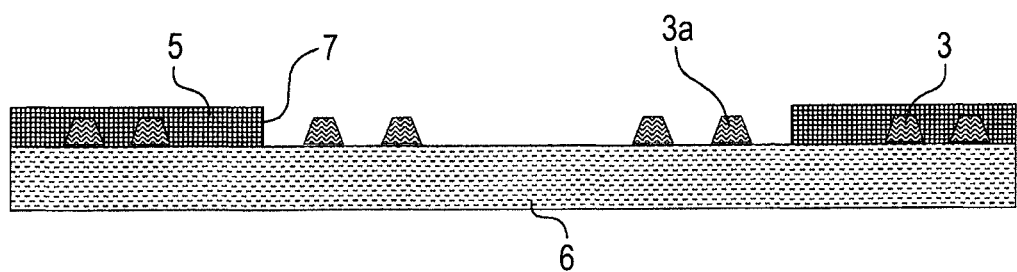
FIGS. 7A and 7B are diagrams illustrating the fabrication method for a semiconductor device according to the second embodiment of the invention (part 2)
Figure 7B:
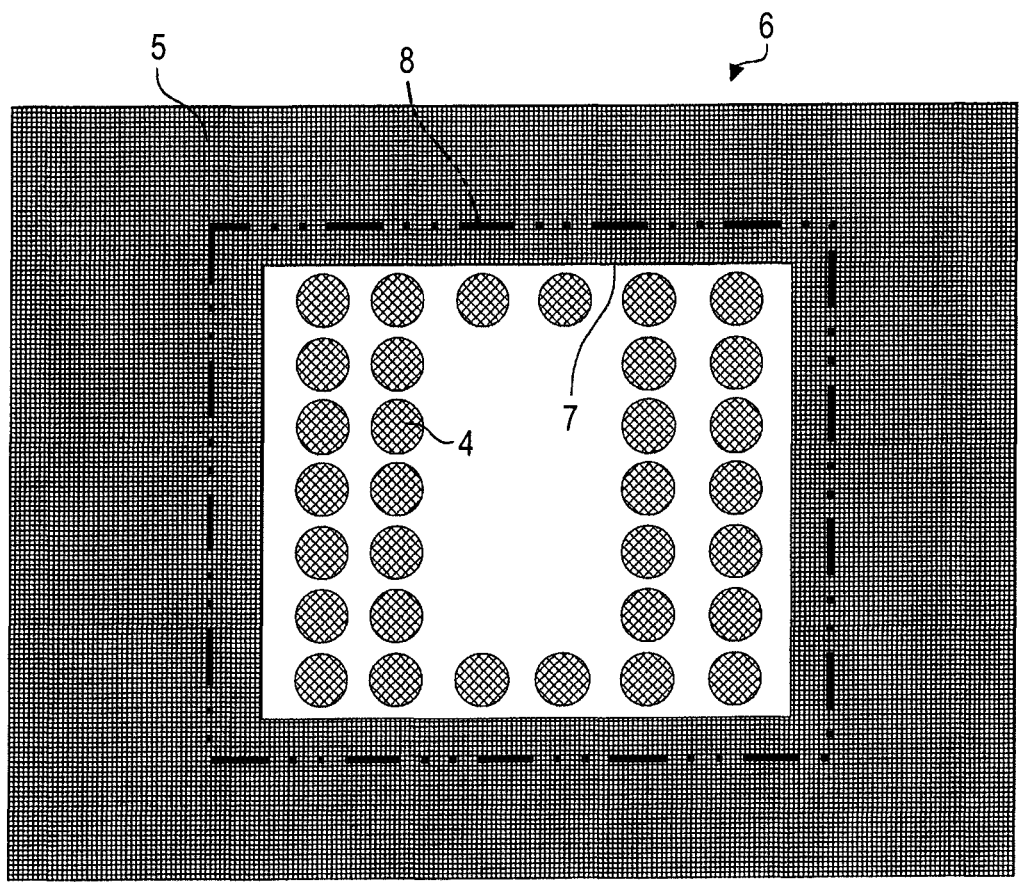

In the board fabrication step, a circuit board 6 having a wiring layer 3 and a protection layer 5 is fabricated as shown in a cross-sectional view in FIG. 7A and a plan view in FIG. 7B. The circuit board 6 contains an organic material, such as glass epoxy, as a main material. The circuit board 6, which serves as an interposer for chip mounting, is equivalent to a mount body. The wiring layer 3 is formed on the major surface (top surface in the diagrams) of the circuit board 6 using a conductive metal. The connecting target portions 3a of the wiring layer 3 are to be connected to the connecting terminals 2 of the semiconductor chip 1. The connecting target portions 3a are provided in 1:1 association with the plurality of connecting terminals 2.

The protection layer 5 is formed using an insulating solder resist. The protection layer 5 is formed to protect the wiring layer 3 and prevent moisture absorption. The protection layer 5 is formed to cover the wiring layer 3 excluding the connecting target portions 3a. The protection layer 5 is formed by, for example, applying a solder resist on the entire major surface of the circuit board 6 by screen printing or the like, and then patterning the solder resist with exposure and development. The protection layer 5 has a quadrangle as viewed planarly formed open so as to expose the connecting target portions 3a of the wiring layer 3, and the edge portion of the opening serves as a resin stop portion 7.

The resin stop portion 7 is provided with a step equivalent to the thickness of the protection layer 5. Given that the thickness of the protection layer 5 is 15 μm, the step of the resin stop portion 7 has approximately the same dimension as the thickness. The resin stop portion 7 is formed in an annular shape to surround the area of the wiring layer 3 where the connecting target portions 3a are arranged. A chip mount area 8 where the semiconductor chip 1 is to be mounted is set in the major surface of the circuit board 6. The chip mount area 8 is defined into a quadrangular shape as viewed planarly to match with the outer shape of the semiconductor chip 1. The resin stop portion 7 is formed inside the chip mount area 8 in a quadrangular shape as viewed planarly.

Though not illustrated, a metal wiring layer on which solder balls to be external connecting terminals is formed on the back side (side opposite to the major surface) of the circuit board 6. This metal wiring layer is exposed through the solder resist forming the protection layer, and is electrically connected to the wiring layer on the major surface (semiconductor chip mount surface) of the circuit board 6 via a through hole or the like.

(Chip Mounting Step)

Figure 8:
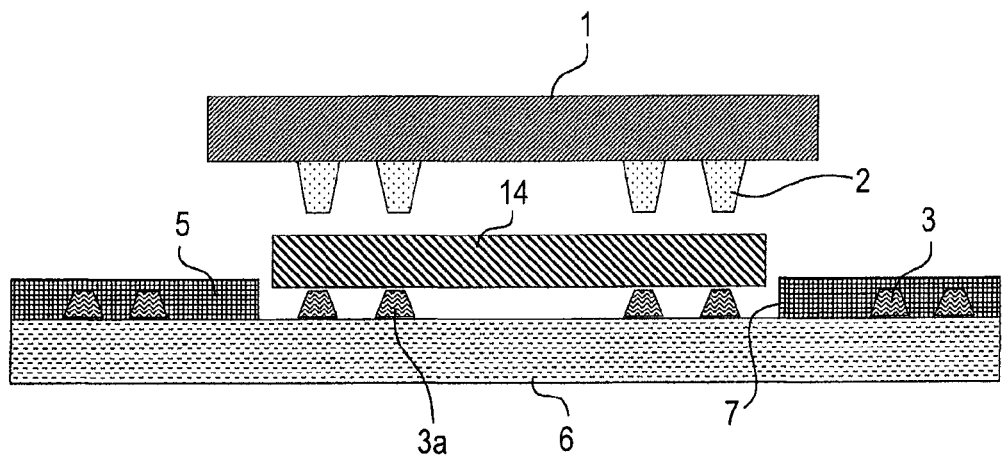
FIG. 8 is a diagram illustrating the fabrication method for a semiconductor device according to the second embodiment of the invention (part 3)
Figure 9A:
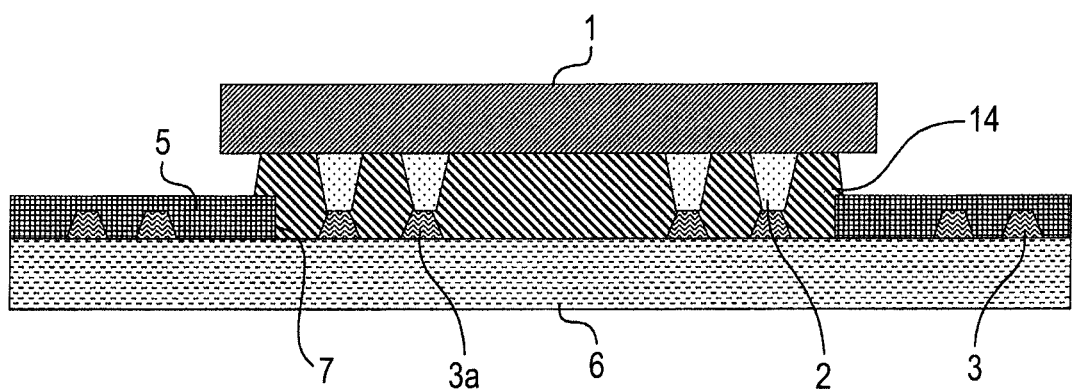
FIGS. 9A and 9B are diagrams illustrating the fabrication method for a semiconductor device according to the second embodiment of the invention (part 4)
Figure 9B:
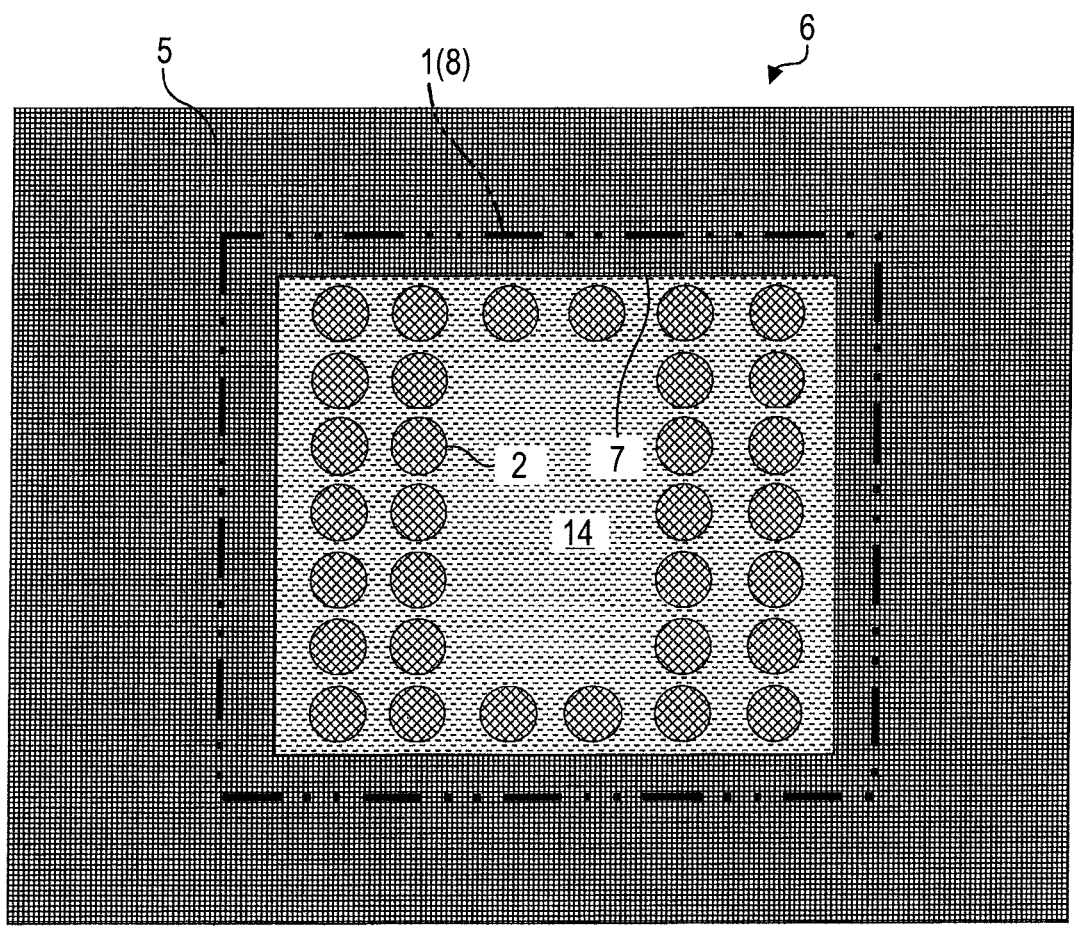

In the chip mounting step, with the major surface of the semiconductor chip 1 facing the major surface of the circuit board 6 and the opening position of the protection layer 5 aligned with the major surface of the circuit board 6 as shown in FIG. 8, a film-like anisotropic conductive resin 14 is arranged. Then, in this state, the semiconductor chip 1 is mounted on the circuit board 6 via the connecting terminals 2 as shown in FIGS. 9A and 9B. The anisotropic conductive resin 14 is a material containing minute conductive particles in an insulating resin film, and crimped between metal terminals so that the conductive particles are intervened between the metal terminals to provide conduction therebetween. In the chip mounting step, the semiconductor chip 1 and the circuit board 6 are connected together by a local reflow process. In the local reflow process, first, the chip's back side where the connecting terminals 2 of the semiconductor chip 1 are not formed is adsorbed by an unillustrated ceramic tool. Next, an alignment mark formed on the major surface of the semiconductor chip 1 adsorbed by the ceramic tool, and an alignment mark formed on the major surface of the circuit board 6 are recognized by respective cameras, and alignment is performed through image processing. Thereafter, with the anisotropic conductive resin 14 intervened between the semiconductor chip 1 and the circuit board 6, the circuit board 6 and the semiconductor chip 1 are crimped. At this time, the connecting terminals 2 of the semiconductor chip 1 are made to contact the connecting target portions 3a of the circuit board 6 with the anisotropic conductive resin 14 placed therebetween, and heat and a load are applied. As a result, the connecting terminals 2 and the connecting target portions 3a are electrically connected by the particulate conductive materials contained in the anisotropic conductive resin 14. Further, the connecting terminals 2 are sealed by the anisotropic conductive resin 14 which has been softened by the heat, and the anisotropic conductive resin 14 is filled between the circuit board 6 and the semiconductor chip 1. Accordingly, the anisotropic conductive resin 14 forms a filling resin (underfill material). Furthermore, the area in the major surface of the circuit board 6 which is wetted with the anisotropic conductive resin 14 softened by the application of the heat and the load is restricted by the resin stop portion 7. Therefore, the resin does not run out around the semiconductor chip 1. As a consequence, the anisotropic conductive resin 14 is retained inside the semiconductor chip 1. In this state, the anisotropic conductive resin 14 is subjected to a heat treatment to be hardened.

(Sealing Step)

Figure 10:
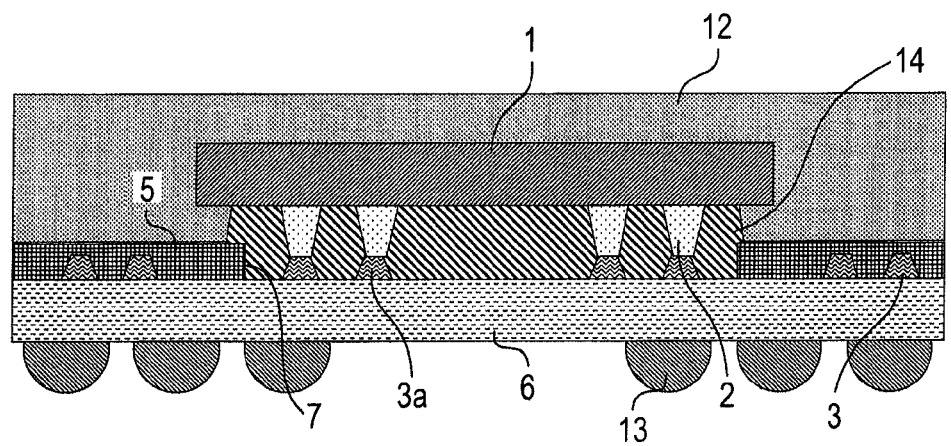
FIG. 10 is a diagram illustrating the fabrication method for a semiconductor device according to the second embodiment of the invention (part 5)

In the sealing step, as shown in FIG. 10, the semiconductor chip 1 is sealed with the sealing resin 12. A plurality of external connecting terminals 13 are formed on the surface of the circuit board 6 opposite to the major surface thereof by using solder balls, for example. The sealing resin 12 is formed of a filler containing silica as a main component, and epoxy resin as per the first embodiment. With regard to the sealing resin 12 as compared with the anisotropic conductive resin 14, the blending amount of the filler can be increased to set the thermal expansion coefficient closer to the material (silicon) of the semiconductor chip 1. Accordingly, the thermal expansion coefficient of the sealing resin 12 is closer to (preferably equal to) that of the chip material (silicon in this embodiment) of the semiconductor chip 1 than that of the anisotropic conductive resin 14. The sealing resin 12 is molded to cover the entire semiconductor chip 1, including the portion in the semiconductor chip 1 which is not covered with the anisotropic conductive resin 14. The sealing resin 12 can surely be filled in the cavity in the semiconductor chip 1 by carrying out resin sealing with a method which achieves a high filling state, such as vacuum molding.

(Configuration of Semiconductor Device)

The semiconductor device provided by the foregoing fabrication method has the following configuration. The semiconductor chip 1 is mounted on the circuit board 6 via the projecting connecting terminals 2. The anisotropic conductive resin 14 is filled between the circuit board 6 and the semiconductor chip 1 to seal the individual connecting terminals 2. The resin stop portion 7 is formed in an annular shape inside the chip mount area 8 on the circuit board 6 in such a way as to surround the layout area of the connecting terminals 2, and retains the anisotropic conductive resin 14. Accordingly, the anisotropic conductive resin 14 is retained inside the semiconductor chip 1 in such a way as not to run out of the four side portions defining the outer peripheral portion of the semiconductor chip 1.

According to the second embodiment of the invention, the contact area between the circuit board 6 and the anisotropic conductive resin 14 becomes narrower as compared with the case where a fillet is formed all around the outer peripheral portion of the semiconductor chip 1. This narrows the range in the board surface of the circuit board 6 where stress originated from the thermal contraction of the anisotropic conductive resin 14 is applied. It is therefore possible to relatively reduce the stress originated from the thermal contraction of the anisotropic conductive resin 14. As a result, warping of the circuit board 6 can be reduced, thus improving the reliability of connection with the semiconductor chip 1. In addition, it is not necessary to secure the area for forming a fillet around the semiconductor chip 1. This can make the size of the circuit board 6 smaller.

The second embodiment of the invention employs the configuration such that the entire semiconductor chip 1 is sealed with the sealing resin 12, including the portion in the semiconductor chip 1 which is not covered with the anisotropic conductive resin 14. Accordingly, stress originated from the thermal contraction of the anisotropic conductive resin 14 can be reduced at the chip end of the major surface of the semiconductor chip 1. It is therefore possible to suppress the separation of the interlayer film on the major surface side of the semiconductor chip 1, thus improving the reliability over a long period of time.

3. Third Embodiment

Figure 11A:
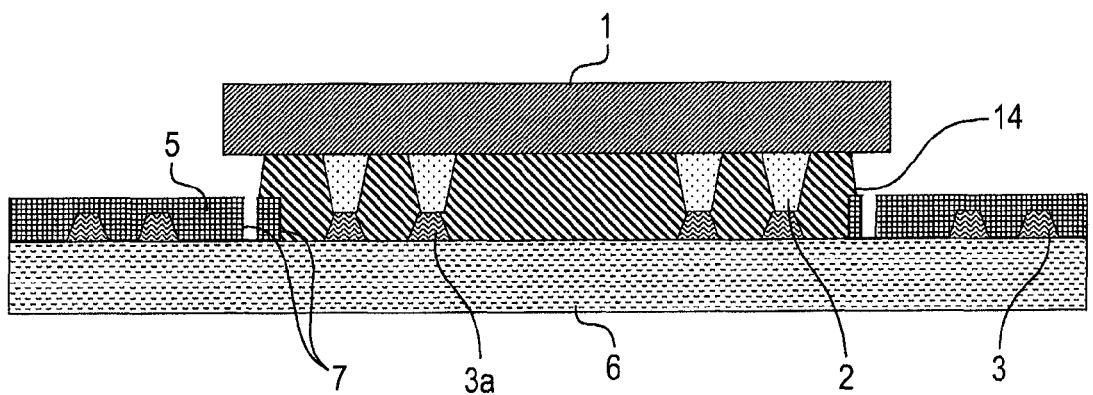
FIGS. 11A and 11B are diagrams showing the configuration of a semiconductor device according to a third embodiment of the invention.
Figure 11B:
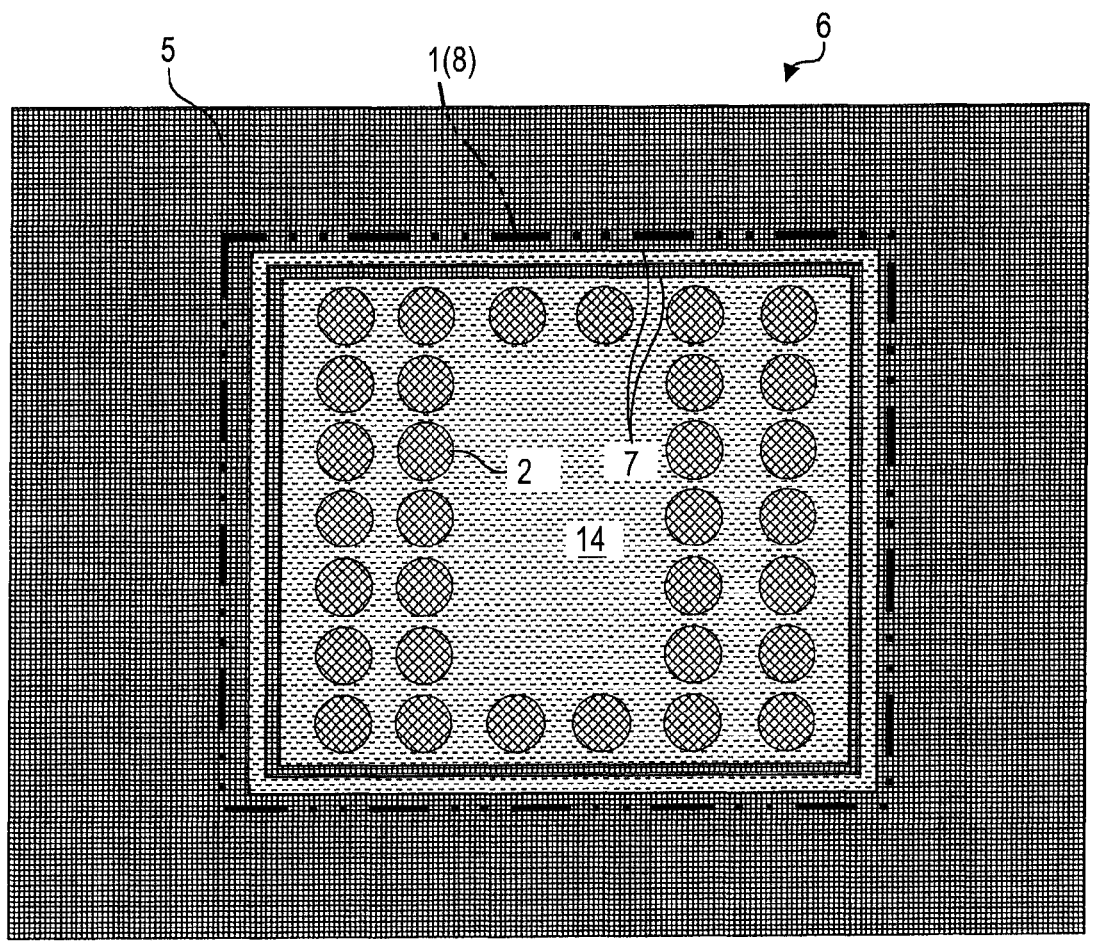

FIGS. 11A and 11B are diagrams showing the configuration of a semiconductor device according to the third embodiment of the invention; FIG. 11A is a cross-sectional view, and FIG. 11B is a plan view. The third embodiment of the invention differs from the above-described second embodiment in that the annular resin stop portion 7 is provided in double on the major surface of the circuit board 6. The resin stop portion 7 is provided in double inward of the chip mount area 8 on the circuit board 6 where the semiconductor chip 1 is to be mounted. The double resin stop portions 7 are arranged concentrically to surround the area where the plurality of connecting terminals 2 are arranged. The resin stop portion 7 is formed in double by patterning the protection layer 5 in the board fabrication step.

According to the third embodiment of the invention, the resin stop portion 7 is formed in double on the major surface of the circuit board 6 at the inner and outer locations. If the anisotropic conductive resin 14 softened by heat rides over the inner resin stop portion 7 in the fabrication method for a semiconductor device (chip mounting step), the run-out of the anisotropic conductive resin 14 can be stopped by the outer resin stop portion 7. Therefore, the anisotropic conductive resin 14 can surely be retained inside the semiconductor chip 1.

Although the resin stop portion 7 is provided in double in the embodiment, which is not restrictive, three or more resin stop portions 7 may be provided. The configuration that has double or multiple resin stop portions 7 more than two can also be applied to the first embodiment as well as other embodiments to be described later.

4. Fourth Embodiment

The description of the fourth embodiment of the invention will be given of a semiconductor device with a COC (Chip On Chip) structure in which a mount body becomes a semiconductor chip, and a method of fabricating the same. The COC structure has an advantage such that higher functions than the functions of a single semiconductor chip can be implemented at a low cost by electrically connecting two different types of semiconductor chips with multiple micro connecting terminals. In an eDRAM (embedded DRAM) according to a related art, for example, mounting DRAMs with large capacities increases the chip size, thus making the mixed mounting difficult in terms of cost and technique. By way of contrast, the COC structure can easily achieve a large capacity by a combination of a Logic chip and a DRAM chip different from each other. Further, electric connection of the chips with a very large number of terminals can achieve the wide band structure, and allow the chips to be accessed fast like the eDRAM. As compared with the related-art stacked package and SiP, the COC structure can make the input/output buffer smaller, thus achieving low power consumption.

(Fabrication Method for Semiconductor Device)

A fabrication method for a semiconductor device according to the fourth embodiment of the invention will be described. The fabrication method for a semiconductor device mainly includes a first chip fabrication step, a second chip fabrication step, a first mounting step, a second mounting step, and a sealing step. Either one of the first chip fabrication step and the second chip fabrication step may be executed earlier, or both steps may be executed in parallel.

(First Chip Fabrication Step)

Figure 12:
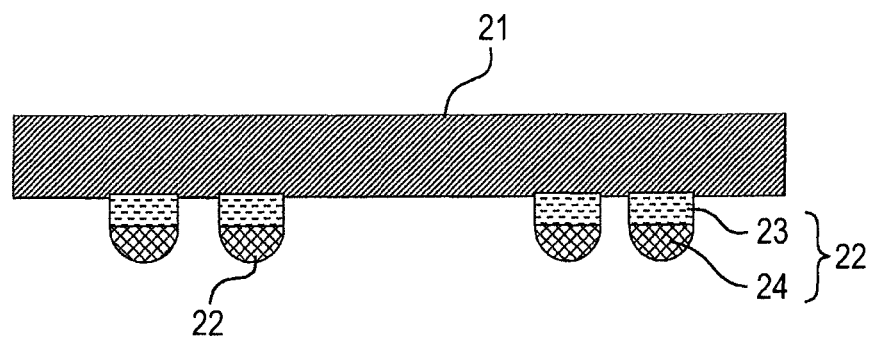
FIG. 12 is a diagram illustrating a fabrication method for a semiconductor device according to a fourth embodiment of the invention (part 1)

In the first chip fabrication step, as shown in FIG. 12, a first semiconductor chip 21 having projecting (convex) connecting terminals 22 is fabricated. The first semiconductor chip 21 is formed of, for example, silicon as a main material. After the connecting terminals 22 are formed at first semiconductor chips 21 in the state of a semiconductor wafer, each first semiconductor chip 21 is diced from the semiconductor wafer whose back side is polished to have a predetermined thickness. The first semiconductor chip 21 is formed into a quadrangle (square or rectangle) as viewed planarly. Unillustrated devices, wirings, etc. are formed in the major surface of the first semiconductor chip 21. An unillustrated electrode pad (e.g., aluminum pad) is formed at the major surface (device forming surface) of the first semiconductor chip 21, and the connecting terminals 22 are formed projecting on the electrode pad. The connecting terminals 22 are formed by a barrier metal layer 23 and a low-melting-point metal layer 24. The barrier metal layer 23 is formed to prevent mutual diffusion. An example of the material for the low-melting-point metal layer 24 is an Sn—Ag alloy. It is desirable that the barrier metal layer 23 should have, for example, a titanium-nickel laminate structure. The diameter of the connecting terminals 2 is, for example, 30 µm or so. The connecting terminals 22 excellent in uniformness can be formed at a low cost by forming each of the layer of nickel which is one of the materials of the barrier metal layer 23, and the layer of the Sn—Ag alloy of the low-melting-point metal layer 24 formed in a semiconductor wafer state by electrolysis plating.

(Second Chip Fabrication Step)

Figure 13A:
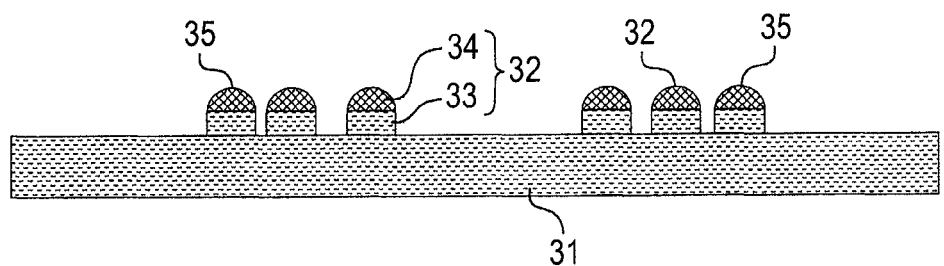
FIGS. 13A and 13B are diagrams illustrating the fabrication method for a semiconductor device according to the fourth embodiment of the invention (part 2)
Figure 13B:
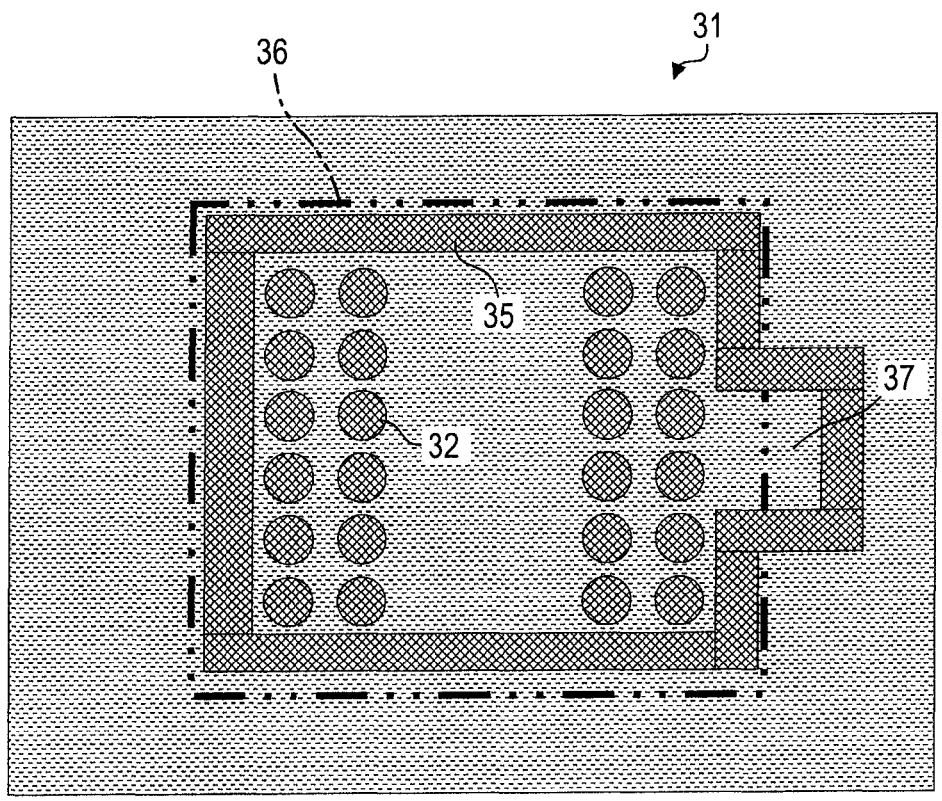

In the second chip fabrication step, as shown in FIGS. 13A and 13B, a second semiconductor chip 31 having projecting (convex) connecting terminals 32 is fabricated. The connecting terminals 32 are formed by a barrier metal layer 33 and a low-melting-point metal layer 34. Basically, the second semiconductor chip 31 is fabricated in the same manner as used for the first semiconductor chip 21. It is to be noted however that individual second semiconductor chips 31 are separated in a larger size than the first semiconductor chip 21 from a semiconductor wafer. A resin stop portion 35 is formed on the major surface of the second semiconductor chip 31 at the same time as the connecting terminals 32. The resin stop portion 35 is formed by using the same material (barrier metal, low melting metal) for the connecting terminals 32. The resin stop portion 35 is formed projecting on the major surface of the second semiconductor chip 31 with a projection size equivalent to the height of the connecting terminals 32. The resin stop portion 35 is formed in an annular shape to surround the area where the plurality of connecting terminals 32 are arranged. A chip mount area 36 where the first semiconductor chip 21 is to be mounted is set in the major surface of the second semiconductor chip 31. The chip mount area 36 is defined into a quadrangular shape as viewed planarly to match with the outer shape of the first semiconductor chip 21. The resin stop portion 35 is formed inward of the chip mount area 36 in a quadrangular shape as viewed planarly. Further, a resin injection portion 37 is provided in the major surface of the second semiconductor chip 31. The resin injection portion 37 is formed outside chip mount area 36. The resin injection portion 37 is formed to communicate with the resin stop portion 35. An unillustrated electrode pad (e.g., aluminum pad) is formed in the major surface of the second semiconductor chip 31 outward of the chip mount area 36.

(First Mounting Step)

Figure 14A:
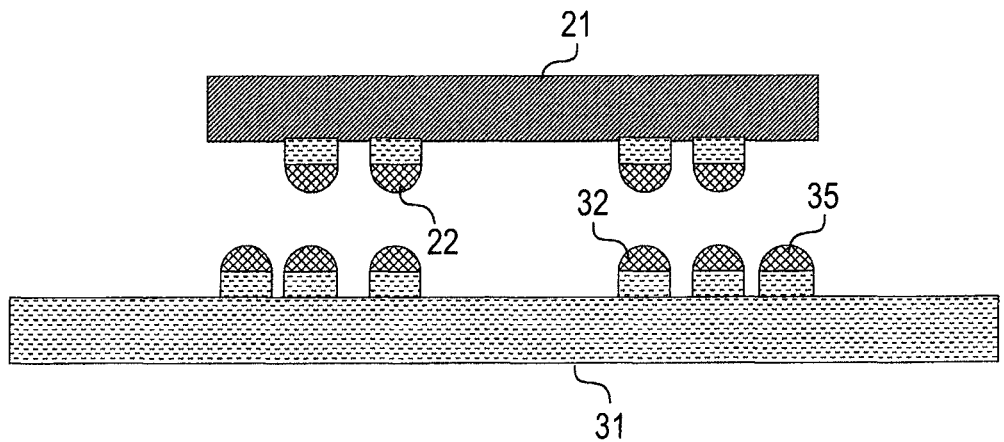
FIGS. 14A to 14C are diagrams illustrating the fabrication method for a semiconductor device according to the fourth embodiment of the invention (part 3)
Figure 14B:
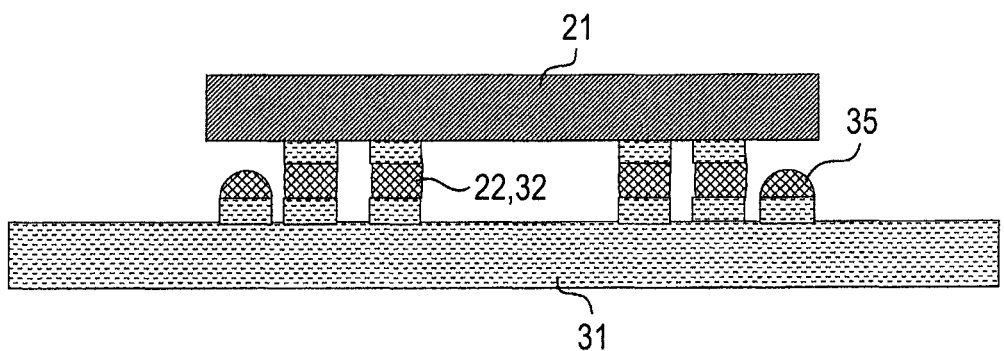

In the first mounting step, with the major surface of the first semiconductor chip 21 facing the major surface of the second semiconductor chip 31 as shown in FIG. 14A, the first semiconductor chip 21 is mounted on the second semiconductor chip 31 via the connecting terminals 22, 32 as shown in FIG. 14B. At this time, the first semiconductor chip 21 and the second semiconductor chip 31 are connected together by a local reflow process. In the local reflow process, first, the back side of the first semiconductor chip 21 where the connecting terminals 22 are not formed is adsorbed by an unillustrated ceramic tool. Next, an alignment mark formed on the major surface of the first semiconductor chip 21 adsorbed by the ceramic tool and an alignment mark formed on the major surface of the second semiconductor chip 31 are recognized by respective cameras, and alignment is performed through image processing. Thereafter, with the connecting terminals 22 of the first semiconductor chip 21 being made in contact with the connecting terminals 32 of the second semiconductor chip 31, heat is applied to the connecting terminals 22, 32. At this time, a load is applied to destroy the natural oxide films on the top surfaces of the low-melting-point metal layers 24, 34, and heat is applied thereto to cause mutual diffusion. In addition, the ceramic tool is moved up or down to adequately adjust the gap between the first semiconductor chips 21 and 31, and the resultant structure is cooled to complete the connection.

Figure 14C:
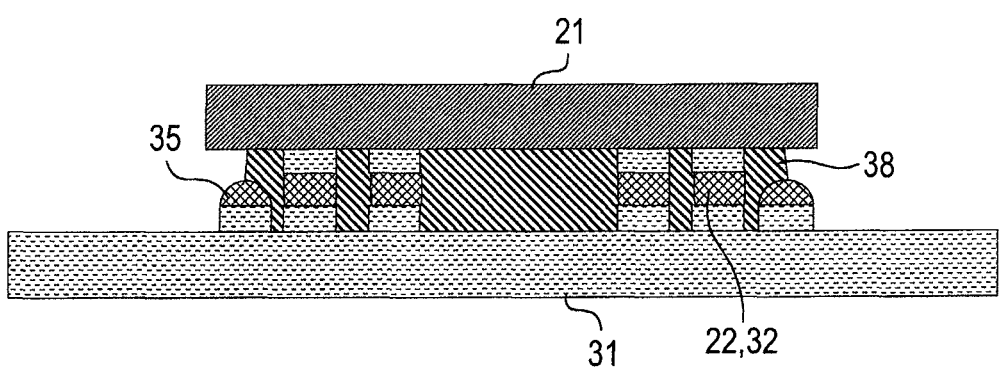

In the first mounting step, as shown in FIG. 14C, a filling resin 38 to be an underfill material is filled between (in the cavity between) the second semiconductor chip 31 and the first semiconductor chip 21. The filling resin 38 is formed of an epoxy resin having a micro filer (diameter of 1 µm or less) mixed therein. At the time the filling resin 38 is filled, a liquid resin is dropped into the resin injection portion 37 from the needle of a micro syringe. The liquid resin dropped down to the resin injection portion 37 from the needle is permeated into the cavity portion between the first semiconductor chip 21 and the second semiconductor chip 31 by the capillarity. At this time, the flow of the resin permeated on the major surface side of the second semiconductor chip 31 by the capillarity is stopped by the resin stop portion 35. Accordingly, the area which is wetted by the resin is restricted by the resin stop portion 35. Therefore, the resin does not run out around the first semiconductor chip 21, excluding the portion where the resin injection portion 37 is provided. As a result, the filling resin 38 is retained inside the first semiconductor chip 21, excluding one side portion where the resin injection portion 37 is provided in the four side portions defining the outer peripheral portion of the first semiconductor chip 21. In this state, the filling resin 38 is hardened in a heat treatment.

(Second Mounting Step)

Figure 15:
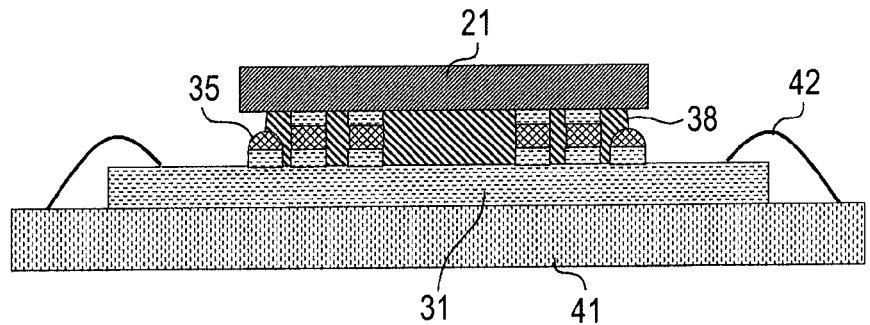
FIG. 15 is a diagram illustrating the fabrication method for a semiconductor device according to the fourth embodiment of the invention (part 4)

In the second mounting step, as shown in FIG. 15, the second semiconductor chip 31 having the first semiconductor chip 21 already mounted thereon is mounted on a wiring board 41 larger in size than the second semiconductor chip 31, and the second semiconductor chip 31 and the wiring board 41 are electrically connected together by metal wires 42. The second semiconductor chip 31 is securely bonded onto the wiring board 41 by using a die bond material. The wires 42 are suspended in a loop between the electrode pad formed on the major surface of the second semiconductor chip 31 and the electrode pad (e.g., gold pad) formed on the major surface of the wiring board 41 by wire bonding.

(Sealing Step)

Figure 16:
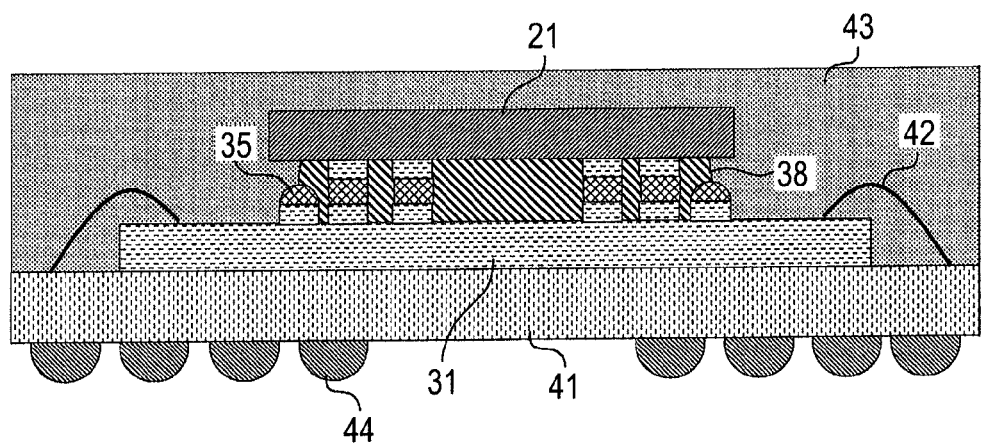
FIG. 16 is a diagram illustrating the fabrication method for a semiconductor device according to the fourth embodiment of the invention (part 5)

In the sealing step, as shown in FIG. 16, the first semiconductor chip 21 and the second semiconductor chip 31 are sealed with a common sealing resin 43. External connecting terminals 44 made by, for example, solder balls are formed on the bottom surface of the wiring board 41 (side opposite to the sealing resin 43). The sealing resin 43 is formed of a filler containing silica as a main component, and epoxy resin. Because the sealing resin 43, unlike the underfill material, need not be filled using the capillarity, the blending amount of the filler can be increased to set the thermal expansion coefficient closer to the material (silicon) of the semiconductor chip as compared with that of the underfill material. Accordingly, the thermal expansion coefficient of the sealing resin 43 is closer to (preferably equal to) that of the chip material (silicon in this embodiment) of the semiconductor chip 21, 31 than that of the filling resin 38. The sealing resin 43 is molded to cover the entire semiconductor chip 21, 31, including the portion in the first semiconductor chip 21 which is not covered with the filling resin 38. The sealing resin 43 can surely be filled in the cavity in the first semiconductor chip 21 by carrying out resin sealing with a method which achieves a high filling state, such as vacuum molding.

(Configuration of Semiconductor Device)

The semiconductor device provided by the foregoing fabrication method has the following configuration. The first semiconductor chip 21 is mounted on the second semiconductor chip 31 via the projecting connecting terminals 22, 32. The filling resin 38 is filled between the second semiconductor chip 31 and the first semiconductor chip 21 to seal the plurality of connecting terminals 22, 32. The resin stop portion 35 is formed in an annular shape inside the chip mount area 36 on the second semiconductor chip 31 in such a way as to surround the layout areas of the connecting terminals 22, 32, and retains the filling resin 38. Accordingly, the filling resin 38 is retained inside the first semiconductor chip 21 in such a way as not to run out of three side portions in the four side portions defining the outer peripheral portion of the first semiconductor chip 21, excluding one side portion where the resin injection portion 37 is provided.

According to the fourth embodiment of the invention, the contact area between the second semiconductor chip 31 and the filling resin 38 becomes narrower as compared with the case where a fillet is formed all around the outer peripheral portion of the first semiconductor chip 21. This narrows the range in the board surface of the second semiconductor chip 31 where stress originated from the thermal contraction of the filling resin 38 is applied. It is therefore possible to relatively reduce the stress originated from the thermal contraction of the filling resin 38. As a result, warping of the second semiconductor chip 31 can be reduced, thus improving the reliability of connection between the semiconductor chips 21, 31. In addition, it is possible to prevent separation or the like of the interlayer films of the first semiconductor chip 21 and the second semiconductor chip 31. Even when a device (analog device, DRAM cell or the like) which is sensitive to stress is mounted on the second semiconductor chip 31 in the vicinity of, for example, the chip end of the first semiconductor chip 21, therefore, the device operation does not easily fail.

Further, according to the fourth embodiment of the invention, it is not necessary to secure the area for forming a fillet around the first semiconductor chip 21. This can make the size of the second semiconductor chip 31 smaller. Furthermore, the amount of the filling resin 38 supplied to a single first semiconductor chip 21 becomes smaller. This leads to reduction in material cost and shorter process time, thus reducing the manufacturing cost. Moreover, the reduction in the supply amount (application amount) of the filling resin 38 to be an underfill material can prevent a part of the filling resin 38 from rising over the first semiconductor chip 21 for the following reason. The time needed for the permeation of the filling resin 38 is longer than the time for supplying the resin, so that a resin residue is formed at the resin injection portion 37. If a large amount of the resin is supplied at this time, the resin is likely to ride over from the side end of the first semiconductor chip 21 to the back side thereof, whereas if a small amount of the resin is supplied, such rising does not easily occur.

The fourth embodiment of the invention employs the configuration such that the entire first semiconductor chip 21 and second semiconductor chip 31 are sealed with the sealing resin 43, including the portion in the first semiconductor chip 21 which is not covered with the filling resin 38. This can reduce stress originated from the difference between the thermal expansion coefficients of the filling resin 38 and the first semiconductor chip 21 at the chip end of the major surface of the first semiconductor chip 21. It is therefore possible to suppress the separation of the interlayer film on the major surface side of the first semiconductor chip 21, thus improving the reliability over a long period of time. In addition, the run-out of the filling resin 38 to the outer peripheral portion of the first semiconductor chip 21 can be prevented by the resin injection portion 37 provided inside the first semiconductor chip 21. Therefore, the electrode pad for wire bonding, which is formed on the second semiconductor chip 31, is not contaminated by the underfill material running out. This makes it possible to arrange the electrode pad for wire bonding in the major surface of the second semiconductor chip 31 in the vicinity of the chip mount area 36. It is therefore possible to cope with the microfabrication-originated reduction of the chip size. Further, restriction on the chip size can be relaxed. Because the resin stop portion 35 can be formed on the second semiconductor chip 31 at the same time as the connecting terminals 32, the semiconductor device can be realized at a lower cost as compared with the case where the resin stop portion 35 is formed in a separate step from the formation of the connecting terminals 32.

Application Example

Figure 17:
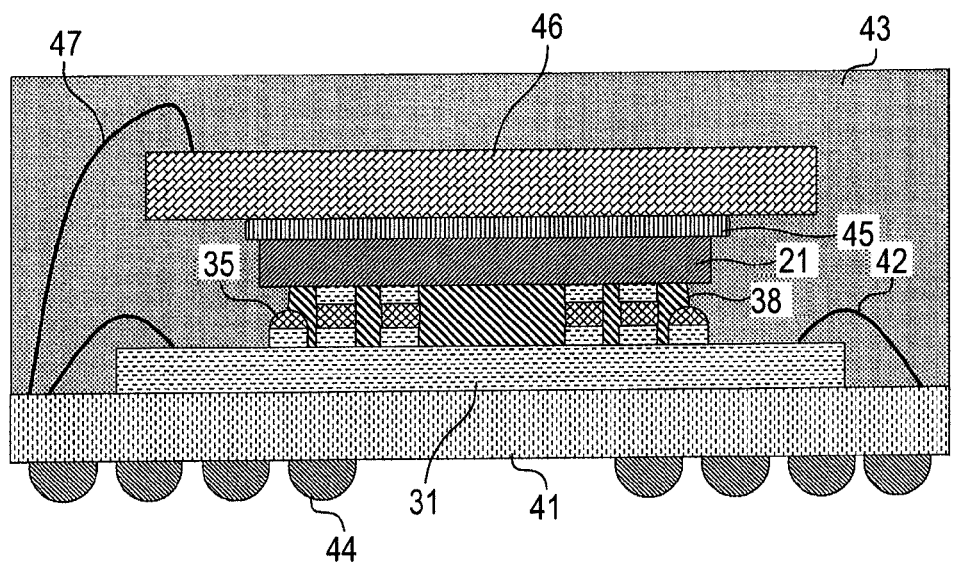
FIG. 17 is a diagram showing an application example of a semiconductor device according to the fourth embodiment of the invention.

FIG. 17 is a diagram showing an application example of the semiconductor device according to the fourth embodiment of the invention. In the illustrated semiconductor device, a semiconductor package 46 is mounted (connected) to the back side of the first semiconductor chip 21 using a jointing material 45 in addition to the mounting structure using the first semiconductor chip 21 and the second semiconductor chip 31. A DAF (Die Attach Film) material is used as the jointing material 45. The semiconductor package 46 is electrically connected to the wiring board 41 by wires 47. The first semiconductor chip 21 and the second semiconductor chip 31 are sealed together with the semiconductor package 46 with the same sealing resin 43.

5. Fifth Embodiment

Figure 18A:
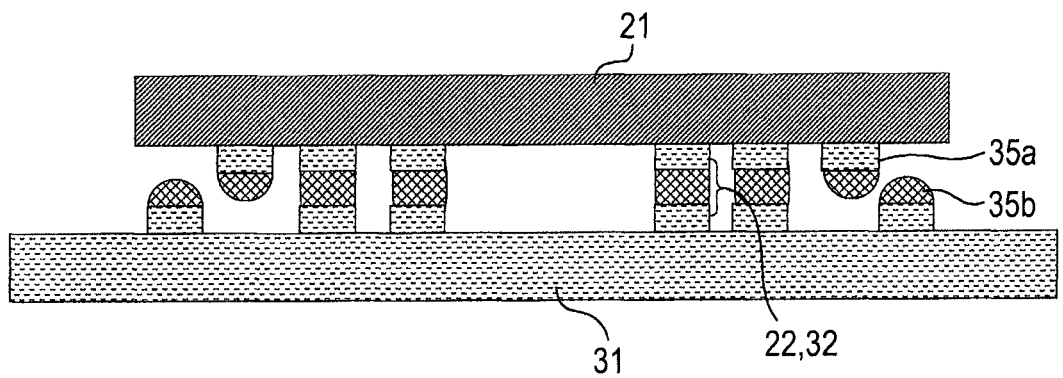
FIGS. 18A and 18B are diagrams showing the configuration of a semiconductor device according to a fifth embodiment of the invention.
Figure 18B:
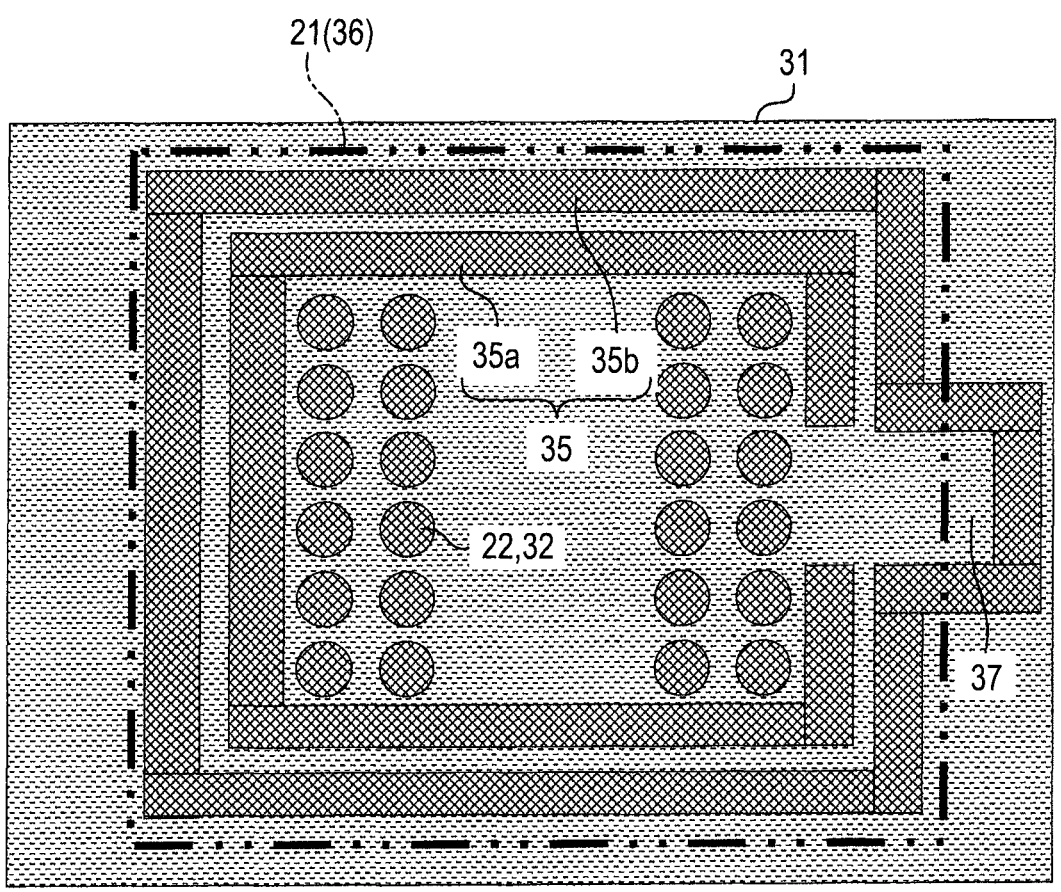

FIGS. 18A and 18B are diagrams showing the configuration of a semiconductor device according to the fifth embodiment of the invention; FIG. 18A is a cross-sectional view, and FIG. 18B is a plan view. The fifth embodiment of the invention differs from the above-described fourth embodiment in that the annular resin stop portion 35 is provided in double inside the chip mount area 36 of the second semiconductor chip 31 in such a way as to surround the layout areas of the connecting terminals 22, 32. The resin stop portion 35 includes a first resin stop portion 35a formed relatively inward, and a second resin stop portion 35b relatively formed outward. The first resin stop portion 35a is formed in the first chip fabrication step at the same time as the connecting terminals 22 are formed on the major surface of the first semiconductor chip 21. The first resin stop portion 35a is formed of the same material and at the same height as the connecting terminals 22. The second resin stop portion 35b is formed in the second chip fabrication step at the same time as the connecting terminals 32 are formed on the major surface of the second semiconductor chip 31. The second resin stop portion 35b is formed of the same material and at the same height as the connecting terminals 32.

According to the fifth embodiment of the invention, the first resin stop portion 35a and the second resin stop portion 35b are respectively formed on the major surface of the first semiconductor chip 21 and the major surface of the second semiconductor chip 31 at the inner and outer locations. If a liquid resin supplied to the resin injection portion 37 rides over the first resin stop portion 35a in the fabrication method for a semiconductor device (first mounting step), the run-out of the resin can be stopped by the second resin stop portion 35b. Therefore, the filling resin 38 can surely be retained inside the first semiconductor chip 21.

Figure 19A:
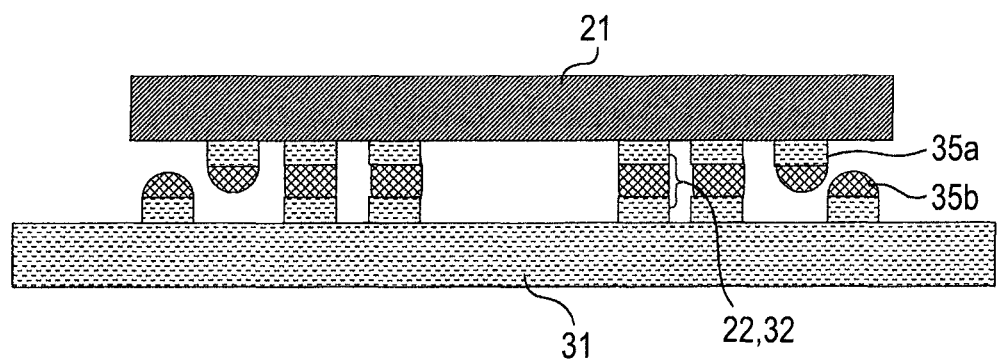
FIGS. 19A and 19B are diagrams showing another configuration of the semiconductor device according to the fifth embodiment of the invention.
Figure 19B:
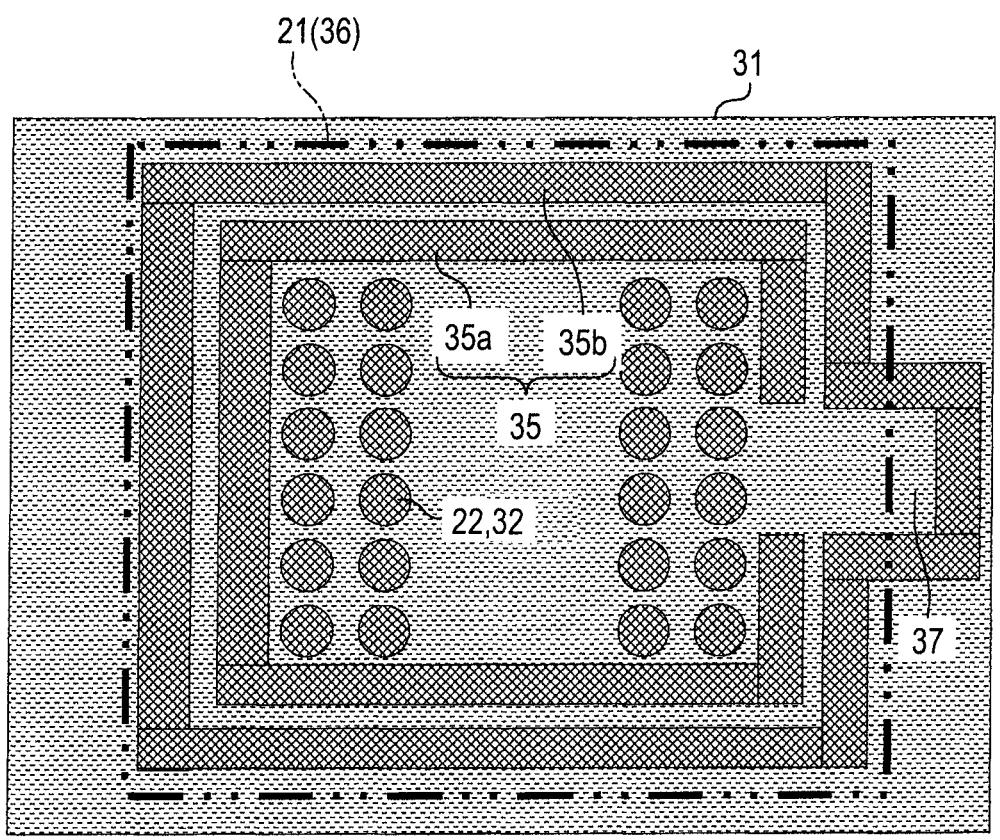

Although the first resin stop portion 35a is provided on the first semiconductor chip 21 and the second resin stop portion 35b is provided on the second semiconductor chip 31 at the time of providing the resin stop portion 35 in double in the embodiment, the invention is not limited to this configuration. For example, both the first resin stop portion 35a and the second resin stop portion 35b may be provided on the major surface of the second semiconductor chip 31, as shown in FIGS. 19A and 19B. In addition, although the resin stop portion 35 is provided in double, which is not restrictive, three or more resin stop portions 35 may be provided.

6. Sixth Embodiment

Figure 20A:
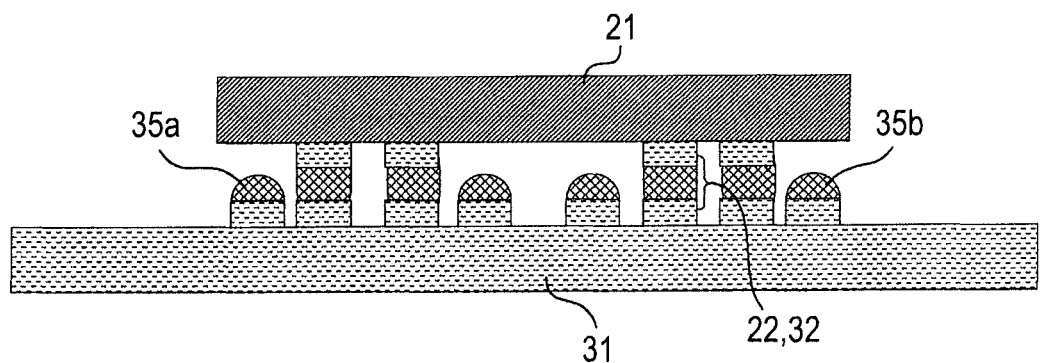
FIGS. 20A and 20B are diagrams showing the configuration of a semiconductor device according to a sixth embodiment of the invention.
Figure 20B:
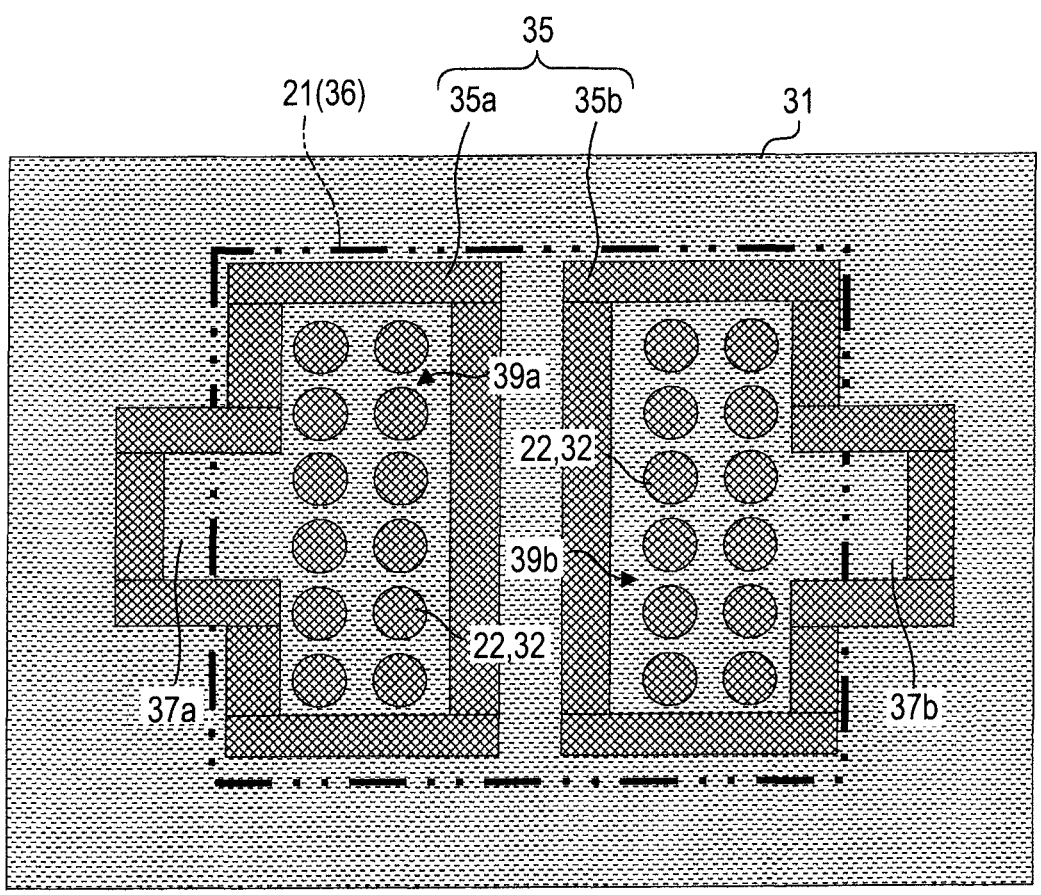

FIGS. 20A and 20B are diagrams showing the configuration of a semiconductor device according to the sixth embodiment of the invention; FIG. 20A is a cross-sectional view, and FIG. 20B is a plan view. The sixth embodiment of the invention differs from the foregoing fourth embodiment particularly in the following configuration. The connecting terminals 22 and connecting terminals 32 are respectively provided on two terminal areas 39a and 39b separately each in the unit of a predetermined quantity (12 in the illustrated example) on the major surface of the first semiconductor chip 21 and the major surface of the second semiconductor chip 31. While the number of the separate terminal areas may be three or greater, it is assumed herein that the number is two. The first resin stop portion 35a and the second resin stop portion 35b are provided side by side on the major surface of the second semiconductor chip 31 inward of the chip mount area 36. The first resin stop portion 35a is formed into a quadrangular shape as viewed planarly so as to surround the predetermined quantity of connecting terminals 22, 32 provided at the terminal area 39a. The second resin stop portion 35b is formed into a quadrangular shape as viewed planarly so as to surround the predetermined quantity of connecting terminals 22, 32 provided at the terminal area 39b. A resin injection portion 37a contiguous to the first resin stop portion 35a, and a resin injection portion 37b contiguous to the second resin stop portion 35b are provided on the major surface of the second semiconductor chip 31. The resin injection portions 37a, 37b are both formed outside the chip mount area 36.

In the sixth embodiment of the invention, the two resin stop portions 35a, 35b are formed respectively at the two separate terminal areas 39a, 39b in such a way as to surround the predetermined quantity of connecting terminals 22, 32. When a liquid resin is supplied to the resin injection portions 37a, 37b communicating with the resin stop portions 35a, 35b, the run-out of the resin is inhibited by the resin stop portions 35a, 35b. Therefore, the filling resin 38 is retained inside the first semiconductor chip 21 in such a way as not to run out of two side portions in the four side portions defining the outer peripheral portion of the first semiconductor chip 21 except for two side portions where the resin injection portions 37a, 37b are provided. Accordingly, as compared with the case where a fillet is formed all around the outer peripheral portion of the first semiconductor chip 21, the contact area between the second semiconductor chip 31 and the filling resin 38 becomes narrower, thus narrowing the range where stress originated from the thermal contraction of the filling resin 38 is applied. In addition, the separate formation of the resin stop portions 35a, 35b for the respective terminal areas 39a, 39b can reduce the amount of the filling resin 38 supplied to a single semiconductor chip 21. This leads to reduction in material cost and shorter process time, thus reducing the manufacturing cost.

Figure 21A:
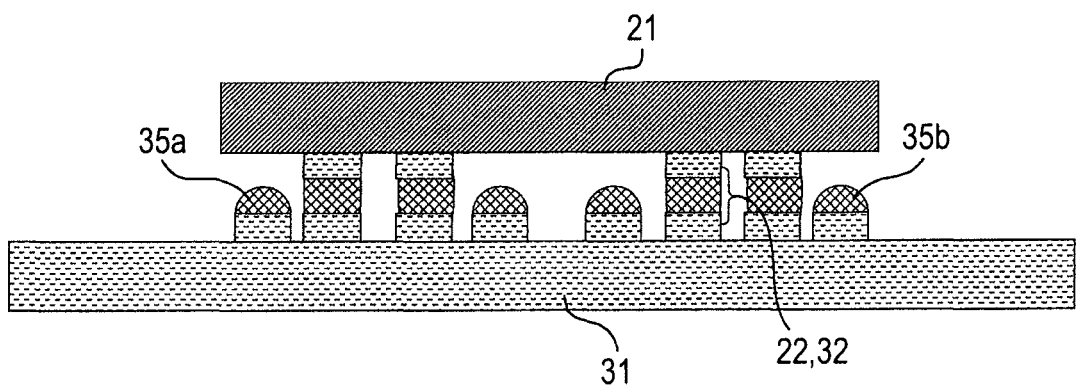
FIGS. 21A and 21B are diagrams showing another configuration of the semiconductor device according to the sixth embodiment of the invention.
Figure 21B:
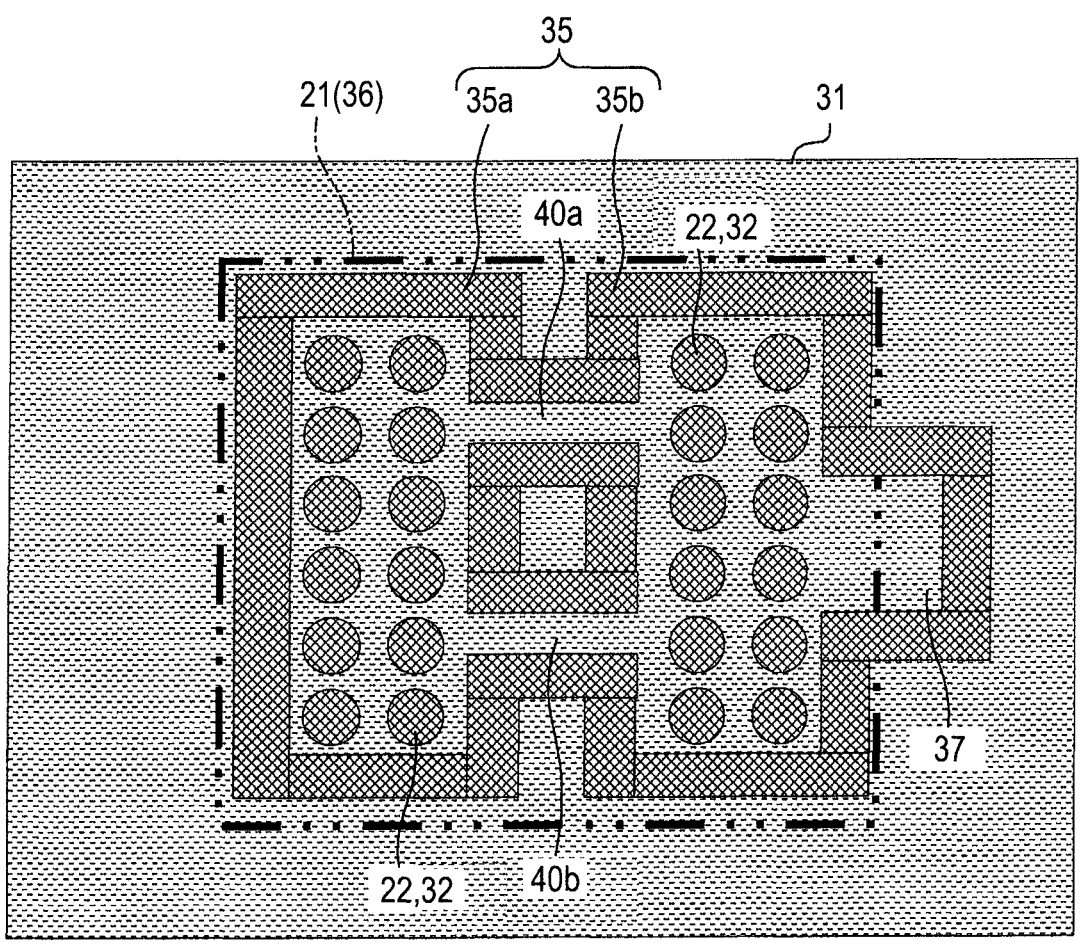

Although the configuration having the first resin stop portion 35a and the second resin stop portion 35b formed completely separately in a planar view is exemplified in the foregoing description of the embodiment, the invention is not limited to this configuration. For example, the resin stop portions 35a, 35b respectively corresponding to the terminal areas 39a, 39b may be communicated with each other by communication portions 40a, 40b as shown in FIGS. 21A and 21B. With this configuration, when a liquid resin is supplied to the resin injection portion 37 contiguous to the resin stop portion 35a, the resin is permeated into the area surrounded by the resin stop portion 35b through the communication portions 40a, 40b from the area surrounded by the resin stop portion 35a. It is therefore unnecessary to provide two resin injection portions 37. Accordingly, the filling resin 38 is retained inside the first semiconductor chip 21 in such a way as not to run out of one side portion where the resin injection portion 37 is provided in the four side portions defining the outer peripheral portion of the first semiconductor chip 21.

Although the filling resin is stopped by the resin stop portion to be retained inside the semiconductor chip, excluding one or two side portions where the resin injection portion 37 is provided in the four side portions defining the outer peripheral portion of the semiconductor chip in the foregoing embodiment, such is not restrictive. That is, if the semiconductor device is configured so that the filling resin is retained inside the semiconductor chip in such a way as not to run out of at least one side portion in the four side portions defining the outer peripheral portion of the semiconductor chip, stress can be reduced as compared with the case where a fillet is formed all around the outer peripheral portion of the semiconductor chip.

The present application contains subject matter related to that disclosed in Japanese Priority Patent Application JP 2009-006282 filed in the Japan Patent Office on Jan. 15, 2009, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor device comprising:
a mount body;
a semiconductor chip mounted on the mount body via projecting connecting terminals; and
a filling resin filled between the mount body and the semiconductor chip to seal the connecting terminals,
the filling resin being retained inside the semiconductor chip in such a way as not to run out of at least one side portion in four side portions defining an outer peripheral portion of the semiconductor chip, wherein a resin stop portion is provided that is formed of dummy connecting terminals, the dummy connecting terminals having a same physical structure as the connecting terminals for providing electrical connections to the semiconductor chip, the dummy connecting terminals being separated from the connecting terminals.

2. The semiconductor device according to claim 1, wherein the resin stop portion is provided inside a chip mount area on the mount body where the semiconductor chip is to be mounted.

3. The semiconductor device according to claim 2, wherein the mount body has a resin injection portion communicating with the resin stop portion, outside the chip mount area.

4. The semiconductor device according to any one of claims 1 to 3, further comprising a sealing resin that seals the semiconductor chip including a portion therein which is not covered with the filling resin, and has a thermal expansion coefficient closer to that of a chip material for the semiconductor chip than that of the filling resin.

5. The semiconductor device according to claim 2 or 3, wherein the resin stop portion is formed in an annular shape surrounding an area where the connecting terminals are arranged.

6. The semiconductor device according to claim 5, wherein the annular resin stop portion is provided at least in double.

7. The semiconductor device according to claim 5, wherein the connecting terminals are provided separated in a plurality of terminal areas by a unit of a predetermined quantity, and
the resin stop portion is formed to surround the predetermined quantity of connecting terminals for each of the plurality of terminal areas.

* * * * *